United States Patent [19]
Ooishi

[11] Patent Number: 5,644,250
[45] Date of Patent: Jul. 1, 1997

[54] STRUCTURE FOR EXTERNALLY IDENTIFYING AN INTERNAL STATE OF A SEMICONDUCTOR DEVICE

[75] Inventor: Tsukasa Ooishi, Hyogo, Japan

[73] Assignee: Mitsubishi Denki Kabushiki Kaisha, Tokyo, Japan

[21] Appl. No.: 463,255

[22] Filed: Jun. 5, 1995

[30] Foreign Application Priority Data

Jun. 30, 1994 [JP] Japan ................... 6-149324

[51] Int. Cl.⁶ .................................................... H03K 19/00
[52] U.S. Cl. ................................................ 326/16; 365/201
[58] Field of Search ........................ 326/16, 83; 365/201; 364/483; 371/22.1

[56] References Cited

U.S. PATENT DOCUMENTS

| | | | |
|---|---|---|---|
| 5,371,712 | 12/1994 | Oguchi et al. | 365/201 |
| 5,388,077 | 2/1995 | Sanada | 365/201 |
| 5,440,516 | 8/1995 | Slemmer | 365/201 |
| 5,471,429 | 11/1995 | Lee et al. | 365/201 |
| 5,475,646 | 12/1995 | Ogihara | 365/201 |

FOREIGN PATENT DOCUMENTS 2-236900  9/1990  Japan .

*Primary Examiner*—David R. Hudspeth
*Assistant Examiner*—Jon Santamauro
*Attorney, Agent, or Firm*—Lowe, Price, LeBlanc & Becker

[57] ABSTRACT

A semiconductor device includes an inner circuit for executing a predetermined function and setting an internal state thereof in response to an internal state setting signal and a current path forming circuit for forming an additional current path between specific two pads in response to the internal state setting signal. Whether or not the internal state of the semiconductor device has been set to a predetermined state, can be externally identified by detecting a current that flows between these specific two pads. The semiconductor device is provided which can be externally identified in simple structure on whether or not the internal state of the semiconductor device has been set to the predetermined state.

23 Claims, 22 Drawing Sheets

24

24

STRUCTURE FOR EXTERNALLY IDENTIFYING AN INTERNAL STATE OF A SEMICONDUCTOR DEVICE

BACKGROUND OF THE INVENTION

1. Field of the Invention

The present invention relates to a semiconductor device, and particularly to a structure capable of easily identifying from an outside of the semiconductor device whether or not an inner circuit is placed under predetermined operating conditions. This invention also relates to a structure for externally identifying whether or not an internal state of a semiconductor device is set so as to satisfy predetermined test conditions.

2. Description of the Related Art

A semiconductor device undergoes various tests after its manufacture to ensure the reliability. As such tests, a burn-in test, an acceleration test employed in a life test or the like, and an operating margin test, etc. are known.

Since an operating power source voltage is set greater than that at the time of the normal operation upon the burn-in test, stress placed on an inner circuit is increased. By activating the semiconductor device under this condition, characteristics of components in the inner circuit are stabilized and a screening (removal of an initial failure) is performed through the revelation of a potential failure. In the case of the acceleration test, the operating power source voltage is similarly raised and operating environments (operating temperature, humidity) are made severe as compared within the normal operation. Under this condition, a period during which the semiconductor device is normally operated is measured. Upon the operating margin test, the power source voltage is slightly reduced as compared within the normal operation. Under this condition, a test is made as to whether or not the semiconductor device is normally operated. As the operating margin test, there are known a test for checking, whether or not a dynamic semiconductor memory device with memory cells including capacitors is accurately storing data by reducing a voltage written into a memory cell capacitor and writing data therein and then reading data therefrom, a test for checking whether or not an access time or the like satisfies a predetermined rated value even when an operating voltage is reduced.

FIG. 20 is a diagram schematically showing the overall structure of a conventional semiconductor device. In FIG. 20, the conventional semiconductor device 900 includes a power pin terminal 902 supplied with an external power source voltage VCE, a ground pin terminal 904 supplied with a ground voltage VSS, a power source line 905 connected to the power pin terminal 902 so as to supply a voltage, a ground line 907 connected to the ground pin terminal 904 so as to supply a ground voltage, an internal voltage down converter 910 which operates with the external power source voltage VCE on the power source line 905 and the ground voltage VSS on the ground line 907 as operating power source voltages and serves so as to supply an internal power source voltage VCI having a predetermined level to an internal power source line 909 when the external power source voltage VCE is within a predetermined range, an internal power source voltage utilizing circuit 912 which operates with the internal power source voltage VCI on the internal power source line 909 and the ground voltage VSS on the ground 907 as operating power source voltages and serves so as to execute a predetermined function, and an input/output buffer 914 which operates with the power source voltage VCE on the external power source line 905 and the ground voltage VSS on the ground line 907 and serves so as to input and output a signal (including data) between the internal power source voltage utilizing circuit 912 and the outside of the semiconductor device. In the structure shown in FIG. 20, the semiconductor device 900 may includes a circuit which operates with externally applied power source voltage VCE and a ground voltage VSS as operating power source voltages, so as to execute a predetermined function. Since internal circuitry of the semiconductor device is operated based on the internal power source voltage VCI, the input/output buffer 914 is supplied with the power source voltage VCE for interfacing.

The reason for allowing the internal voltage down converter 910 to reduce the externally supplied power source voltage VCE to produce the internal power source voltage VCI is as follows:

Components or elements are subject to miniaturization or micronization with progress of high integration of the semiconductor device. A power source voltage level is reduced in accordance with a scaling rule, for example, to ensure the reliability of the sub-micronized components and to reduce power consumption. However, the semiconductor device is not singly used and a plurality of kinds of semiconductor devices are used upon constructing a system. A logic LSI (Large-Scale Integrated) circuit, a processor and a semiconductor memory device are different in integration progress speed and element-micronization progress speed from each other. It is thus necessary to use, as a system power source voltage, a voltage determined by the LSI in which the element micronization progress speed is the slowest. Since the micronization progress speed of the semiconductor memory devices is the fastest, a power source voltage higher than an internal power source voltage necessary for the semiconductor memory devices is used as an external power source voltage. Therefore, the internal voltage down converter 910 is provided to reduce the external power source voltage VCE and produce the internal power source voltage VCI lower the external power source voltage VCE inside the semiconductor device. Owing to the provision of such an internal voltage down converter 910, a system using a single system power source can be constructed using a plurality of kinds of LSIs different in operating power source voltage from each other.

FIG. 21 is a block diagram showing the structure of an internal voltage down converter shown in FIG. 20. In FIG. 21, an internal voltage down converter 910 includes a reference voltage generating circuit 922 for generating a reference voltage Vref having a predetermined level, a drive transistor 924 composed of a p channel MOS transistor (insulated gate type field effect transistor) for supplying current to an internal power source line 909 to generate an internal power source voltage VCI from an external power source voltage VCE supplied to a power source line 905, and a comparator 926 for comparing the internal power source voltage VCI on the internal power source line 909 and the reference voltage Vref generated from the reference voltage generating circuit 922 and adjusting the conductance of the drive transistor 924 in accordance with the result of comparison. The comparator 926 receives internal power source voltage VCI at a positive input and reference voltage Vref at a negative input.

The internal voltage down converter 910 further includes an n channel MOS transistor 928 which is brought conductive in response to a burn-in mode designation signal BI as an internal state setting signal to electrically connect an output node 929 of the comparator 926 and a ground line 907 to each other. Owing to the provision of the MOS transistor 928, the drive transistor 924 is forcedly brought into a conducting state to equalize the internal power source voltage VCI and the external power source voltage VCE to each other, thereby setting the internal power source voltage VCI to a desired voltage level.

An internal power source voltage utilizing circuit 912 includes a load circuit 912a operating with the internal power source voltage VCI on the internal power source line 909 and a ground potential on a ground line 907 as operating power source voltages. The internal power source voltage utilizing circuit 912 includes a plurality of kinds of load circuits 912a for respective functions, to which the internal power source voltage is supplied through different interconnection lines (for the stabilization of the internal power source voltage due to the dispersion of loads on the power source lines). Therefore, the load circuit 912a included in the internal power source voltage utilizing circuit 912 is representatively shown in FIG. 21. The operation of the circuitry of FIG. 21 will now be described in brief.

In the normal operating mode, the burn-in mode designation signal as the internal state setting signal (hereinafter called simply "burn-in mode designation signal") BI is at a low level indicative of an inactive state and the MOS transistor 928 is in an off state. In this state, the drive transistor 924 supplies a current to the internal power source line 909 in response to the potential on the output node 929 of the comparator 926 to generate the internal power source voltage VCI. When the internal power source voltage VCI is higher than the reference voltage Vref, the potential at the output node 929 of the comparator 926 is raised so that the conductance of the drive transistor 924 is reduced. Thus, the current (drain current) supplied from the drive transistor 924 is reduced so that an increase of the internal power source voltage VCI is stopped.

When the load circuit 912a is activated and the internal power source voltage VCI on the internal power source line 909 is reduced and becomes lower than the reference voltage Vref due to a leakage current on the internal power source line 909, a signal potential supplied to the output node 929 from the comparator 926 is reduced. Thus, the conductance of the drive transistor 924 is made greater to allow the drive transistor 924 to supply a large current to the internal power source line 909, and the internal power source voltage VCI is raised. Owing to a feedback loop formed by the comparator 926, the drive transistor 924 and the internal source line 909, the internal power source voltage VCI on the internal power source line 909 is brought to a voltage level determined by reference voltage Vref. The internal power source voltage VCI is normally made equal to the reference voltage Vref.

When a test operation is effected on the internal voltage down converter, the burn-in mode designation signal BI is set to an "H" indicative of an active state. At this time, the MOS transistor 928 is turned on so that the potential of the gate of the drive transistor 924 (the potential at the node 929) is forcedly brought to a ground potential level. Thus, the drive transistor 924 is brought conductive regardless of the output potential of the comparator 926 so as to supply the external power source voltage VCE to the internal power source line 909. As a consequence, the internal power source voltage VCI varies in accordance with the external power source voltage VCE.

FIG. 22 is a diagram for illustrating a relationship between an external power source voltage VCE and an internal power source voltage VCI. In FIG. 22, the axis of abscissa represents an external power source voltage and the axis of ordinate shows a voltage value. When the external power source voltage VCE is raised from the initial state, the reference voltage Vref generated from the reference voltage generating circuit 922 is also raised. Correspondingly, the internal power source voltage VCI increases as well. When the external power source voltage VCE reaches a predetermined value V0, the reference voltage Vref is brought to a constant value. Thus, the internal power source voltage VCI is maintained at a constant value for the level of the external power source voltage VCE which is more than or equal to the predetermined value V0. In the normal operation, an external power source voltage VCE in a voltage region ranging from V0 to V1 indicated as "normal usage region" in FIG. 22 is supplied to activate the semiconductor device. In this condition, the burn-in mode designation signal BI is at an "L" level.

When the burn-in mode designation signal BI is "H" level, the internal power source voltage VCI is raised in accordance with the external power source voltage VCE. In the burn-in mode test, the external power source voltage VCE is generally set to a voltage level between voltages V2 and V3. In order to vary the internal power source voltage VCI according to the external power source voltage VCE, two methods are proposed: a method of setting the burn-in mode designation signal BI to the "H" when the internal power source voltage VCI is a constant voltage (reference voltage Vref) level, and a method of setting the burn-in mode designation signal BI to the "H" when the external power source voltage VCE is reduced to the predetermined value V0 or less and then varying the internal power source voltage VCI in accordance with the external power source voltage VCE. FIG. 22 shows a level of an internal power source voltage VCI in a region (indicated as a "stress region" in FIG. 22) in which the burn-in mode designation signal is simply generated and the burn-in mode test is executed under this condition.

By setting the internal power source voltage VCI higher than that at the time of the normal operation, stress placed on components of the internal power source voltage utilizing circuit 912 is increased. Under this condition, a potential failure screening is performed.

By making use of the internal voltage down converter having the aforementioned construction, the internal power source voltage VCI can be varied according to the external power source voltage VCE even in other test operation as well as in the burn-in mode test so as to be set to a desired voltage level.

A test such as a burn-in mode test or the like is a final test prior to shipping of semiconductor devices and is also a non-destructive inspection. Namely, the semiconductor device is tested in a state of being accommodated within a package. In general, the test on the semiconductor device such as the burn-in mode test is not performed for each semiconductor device singly but is carried out on a plurality of semiconductor devices as a single unit.

FIG. 23 shows an arrangement of semiconductor devices in a burn-in mode test. In FIG. 23, a plurality of semiconductor devices (chips) CH00 through CHmn are disposed on a test board 950. Although the semiconductor devices are represented as "chips" in FIG. 23, they are accommodated in a package by resin sealing or the like, not in the form of flip chips.

Further, a monitor flip chip 952 fabricated in the same batch as that of the semiconductor devices CH00 through CHmn, is disposed on the test board 950. In the flip chip 952, pads PDs and inner circuits on which a sealing resin forming a package has been removed, have been exposed. The pads PDs are connected to corresponding external pin terminals PT by bonding wires BD. The pin terminals PT of the flip chip 952 are identical in arrangement to the semiconductor devices CH00 through CHmn. Further, a testing apparatus 960 is provided which applies a voltage to the test board 950 in a predetermined sequence, operates the semiconductor devices CH00 through CHmn and the flip chip 952 and analyzes the result of their operations.

A check apparatus 962 is provided corresponding to the flip chip 952. The check apparatus 962 detects a potential at an internal node ND of the flip chip 952 using a probe PB and checks whether or not the flip chip 952 has been set to a predetermined internal state. The check apparatus 962 may be included in the testing apparatus 960. To clearly show a test arrangement, the testing apparatus 960 and the check apparatus 962 are shown being provided separately from each other. A test operation will now be described.

Under the control of the testing apparatus 960, a burn-in mode designation signal BI is supplied to each of the semiconductor devices CH00 through CHmn and the monitor flip chip 952 all placed on the test board 950. The check apparatus 962 detects a potential at the predetermined node ND (corresponding to the output node 929 in FIG. 21, for example) of the monitor flip chip 952, using the probe PB. When the check device 962 detects the potential at the node ND, which has been brought to a predetermined potential (e.g., a ground potential), the corresponding nodes of all the semiconductor devices CH00 through CHmn are considered to be at predetermined potential levels and an external power source voltage VCE is raised by the testing apparatus 960, whereby the burn-in test is effected on each of the semiconductor devices CH00 through CHmn.

When it is desired to perform the burn-in test as described above, it is necessary to fabricate the monitor flip chip 952. The monitor flip chip 952 is fabricated by selecting a semiconductor device within the same batch as that of the semiconductor devices CH00 through CHmn to be tested and by removing a sealing resin that is a package for accommodating the selected semiconductor device therein. Therefore, a problem arises that much labor is required to fabricate the monitor flip chip 952, so that the burn-in test cannot be efficiently performed. Further, a problem arises that the monitor flip chip 952 is not recycled and shipped as a product due to the removal of a whole package, resulting in poor product efficiency.

A problem also arises that since internal states of the semiconductor devices CH00 through CHmn to be tested are determined by identifying the internal state (the potential at the predetermined node ND) of the monitor flip chip 952, even in the case where the semiconductor devices CH00 through CHmn to be tested have not been accurately set to desired internal states due to variations in operating parameters between the chips, they are erroneously determined to be set to the desired internal states, and may be subject to a test, whereby the accurate test cannot be ensured.

Further, a problem arises that it is necessary to provide the check apparatus 952 for detecting the potential at the predetermined node of the monitor flip chip, thereby causing an increase in the scale of the testing system. In addition to the above problem, a problem also arises that a dedicated jig is required to detect the potential at the predetermined node of the monitor flip chip, thereby causing an increase in the cost of the testing system.

Furthermore, a problem arises that when it is desired to test an operating margin or the like of a semiconductor device as well as a normal burn-in test, it is not possible to accurately identify whether or not an internal state of the semiconductor device accommodated in a package has been set to a predetermined state, whereby difficulties are encountered in accurately evaluating operating characteristics.

SUMMARY OF THE INVENTION

It is an object of the present invention to provide a semiconductor device having an internal state thereof externally monitored easily.

It is another object of the present invention to provide a semiconductor device capable of easily realizing an environment that allows a desired test to be efficiently and accurately executed.

It is a further object of the present invention to provide a semiconductor device which permits the simplification of a testing apparatus.

Briefly stating, according to the present invention, a current flowing path is formed between specific two pads in a chip when a predetermined internal state setting signal is supplied and a current that flows through the path is externally detected.

It is possible to easily identify from the outside based on the detected current whether or not a semiconductor device has been set to a desired internal state.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
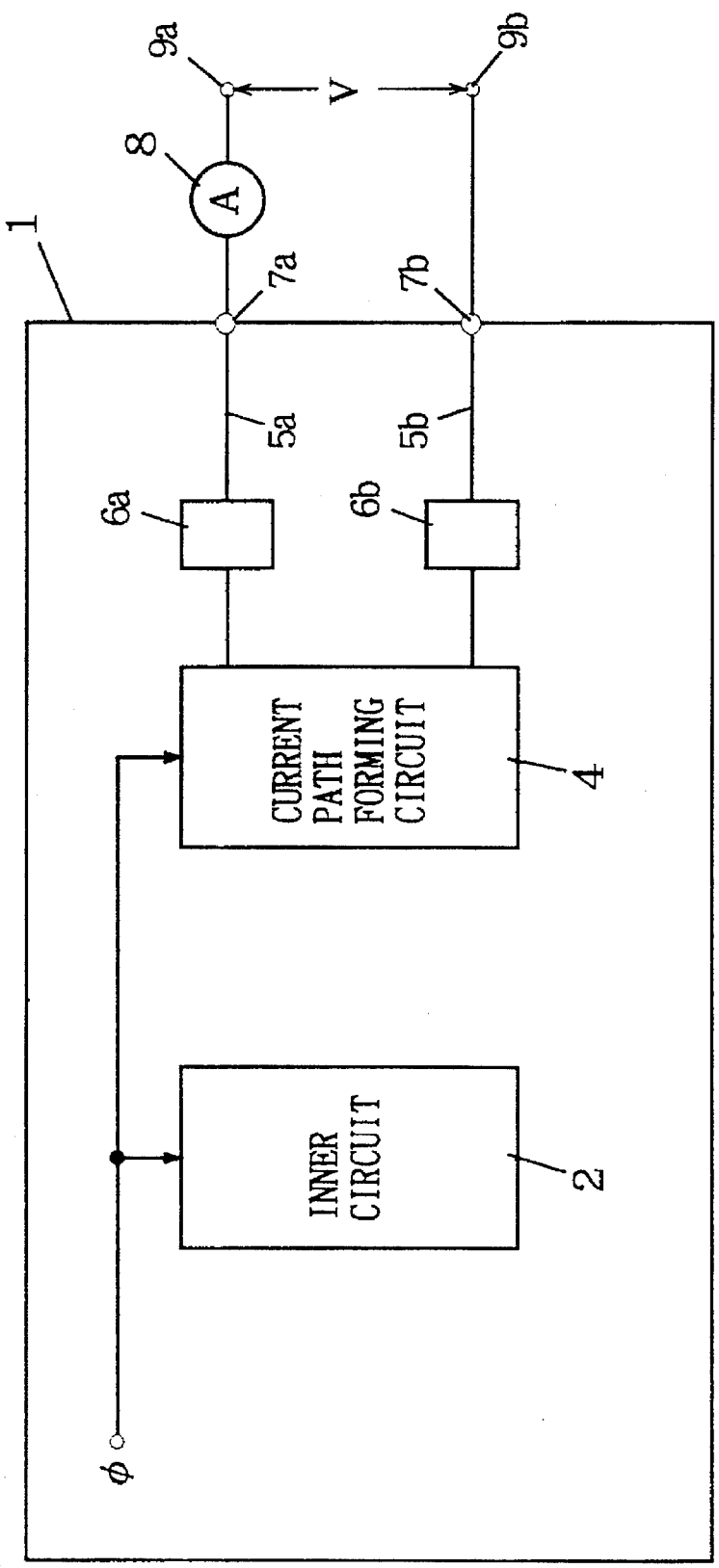
FIG. 1 is a diagram schematically showing the overall structure of a semiconductor device according to the present invention.

FIG. 1 is a diagram schematically showing the structure of a semiconductor device according to the present invention. In FIG. 1, the semiconductor device 1 includes an inner circuit 2 for executing a predetermined function and setting an internal state thereof to a predetermined state in response to a control signal φ and a current path forming circuit 4 for forming a current path between pads 6a and 6b in response to the control signal φ. The control signal φ may be an internal state setting signal alone as will be described later in detail. Alternatively, the control signal φ may include an internal state setting signal and a period designation signal for designating a period during which a current path is formed.

Pads 6a and 6b are required only to be separate from each other, and any pads can be used therefor. The pads 6a and 6b are respectively connected to pin terminals 7a and 7b through bonding wires 5a and 5b. The semiconductor device 1 may be a device in which the pads 6a and 6b are coupled directly to a circuit board through bump bulbs. However, a structure of sealing the semiconductor device into a package with a resin is shown in FIG. 1 as an illustrative example. Therefore, this device is shown such that external pin terminals 7a and 7b are provided.

Upon a predetermined operating mode such as a burn-in test, the control signal φ is brought into an active state and a current path is formed between the pads 6a and 6b by the current path forming circuit 4. An external device applies a voltage between the pin terminals 7a and 7b. FIG. 1 shows the state in which a voltage V is applied between voltage application nodes 9a and 9b of a testing apparatus, for example. An ammeter 8 is disposed between the node 9a and the pin terminal 7a. When the current path is formed by the current path forming circuit 4, a current flows over a path of the node 9a, the pin terminal 7a, the pad 6a, the current path forming circuit 4, the pad 6b, the pin terminal 7b and the node 9b. Whether or not the current path is formed by the current path forming circuit 4 can be identified based on the current detected by the ammeter 8. It is determined, based on whether or not the current path is formed, whether or not the state of the inner circuit 2 is set to a predetermined state.

The internal state of the semiconductor device 1 can be identified by detecting the current with the ammeter 8 at the outside. It is unnecessary to use an additional flip chip used for a monitor in order to identify the internal state of the semiconductor device 1. It is, therefore, possible to easily identify whether or not the semiconductor device 1 has been set to a predetermined internal state. Respective specific structures will be described below. In the following description, the semiconductor device is assumed to include an internal voltage down converter for comparison with the conventional example. A structure for identifying whether or not an internal power source voltage has been set to a state in which the internal power source voltage can be varied depending on an external power source voltage upon executing the burn-in test, will be described. However, the present invention can be generally applied to any device structure as far as the internal state of the semiconductor device is set to the predetermined state based on the internal state setting signal.

First Embodiment

Figure 2:
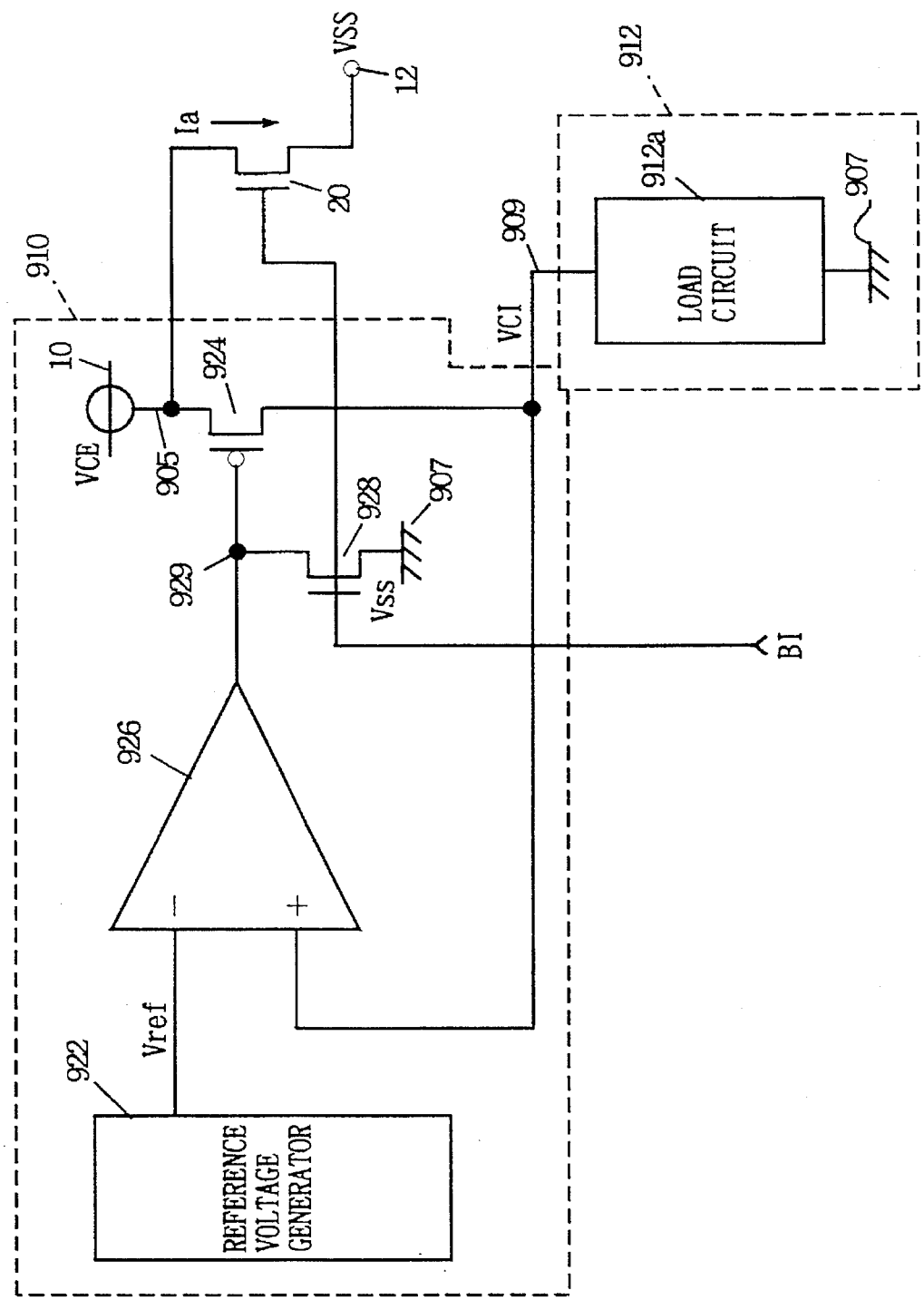
FIG. 2 is a diagram illustrating the structure of a principal part of a semiconductor device according to a first embodiment of the present invention.
Figure 21:
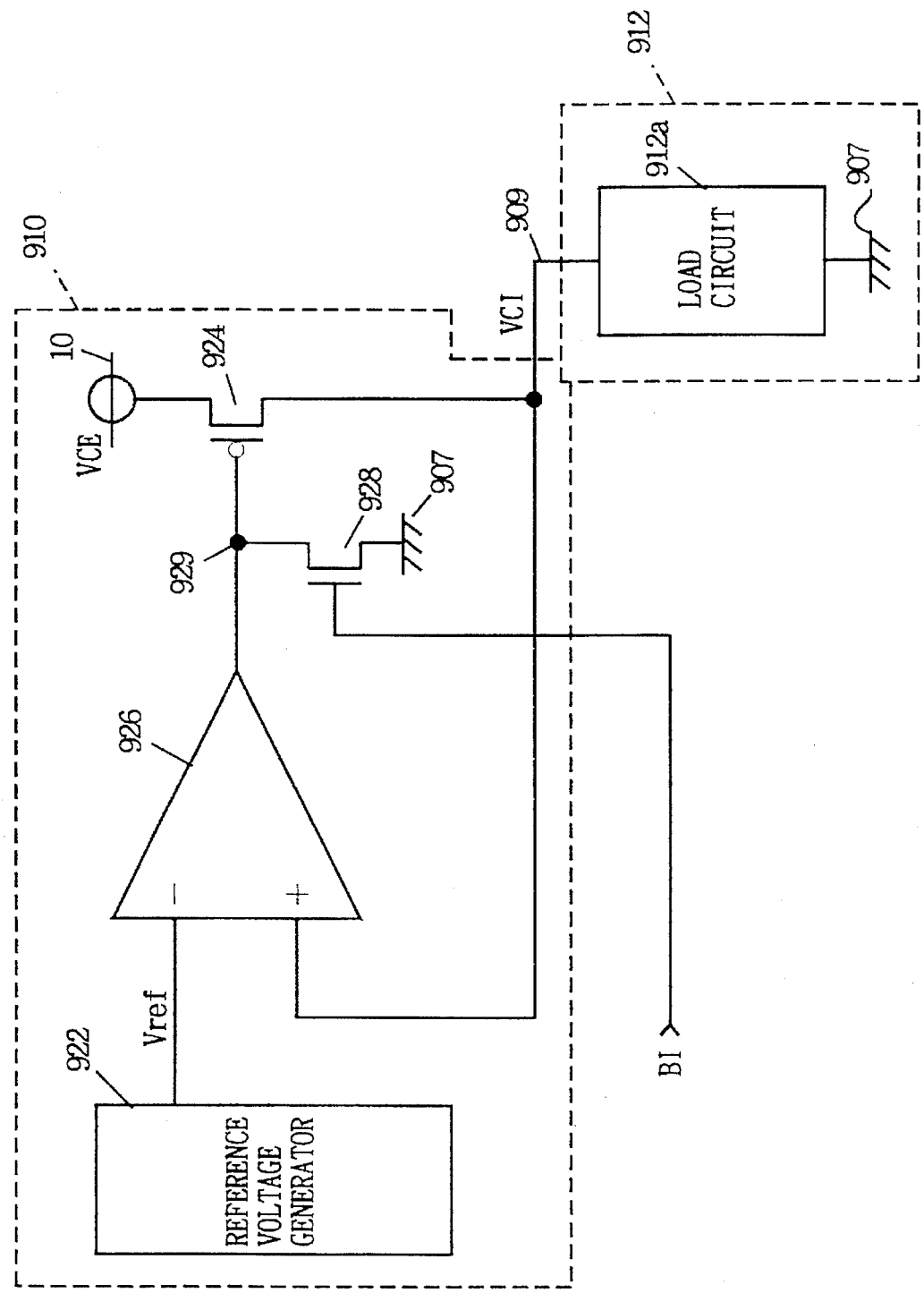
FIG. 21 is a diagram schematically illustrating the structure of a principal part of the conventional semiconductor device.
Figure 22:
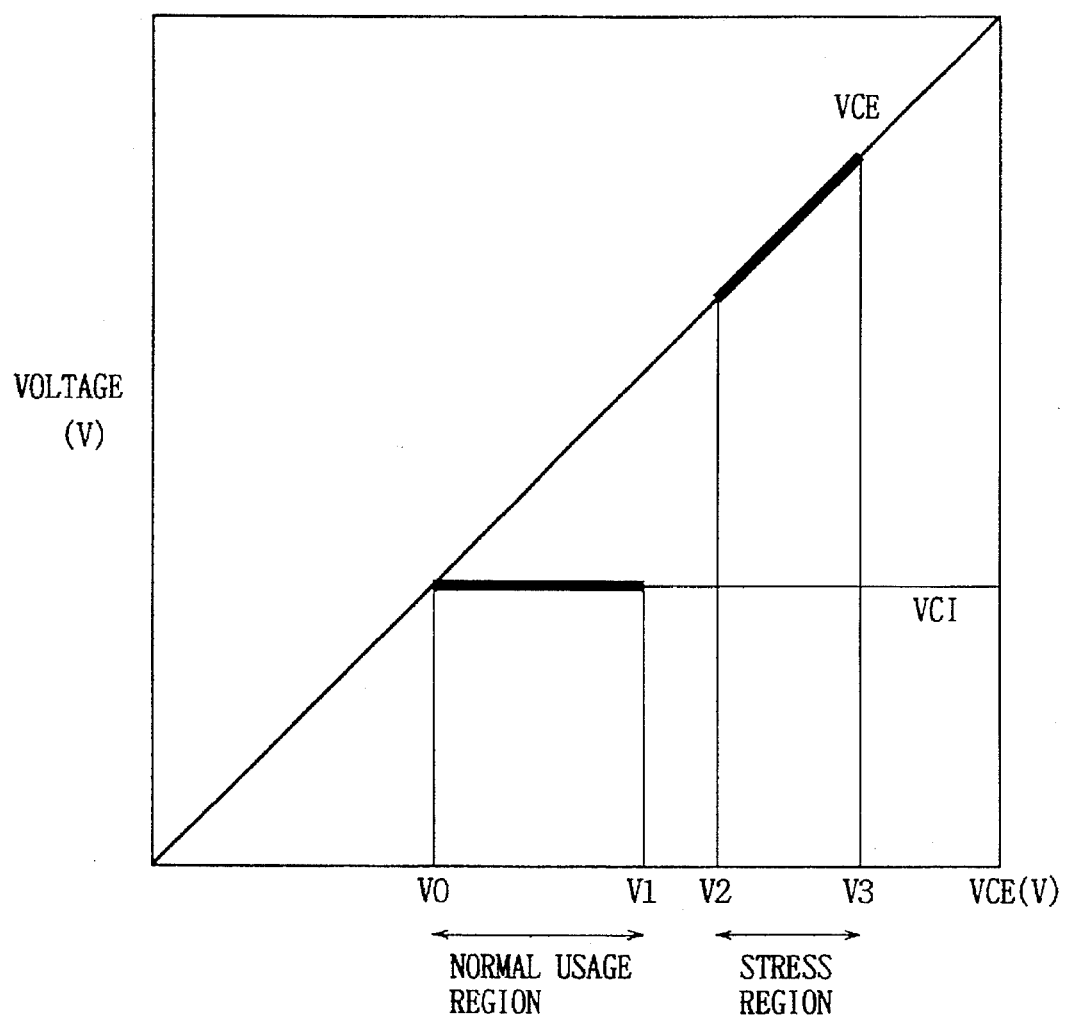
FIG. 22 is a diagram for indicating the operation of an internal voltage down converter shown in FIG. 21.
Figure 23:
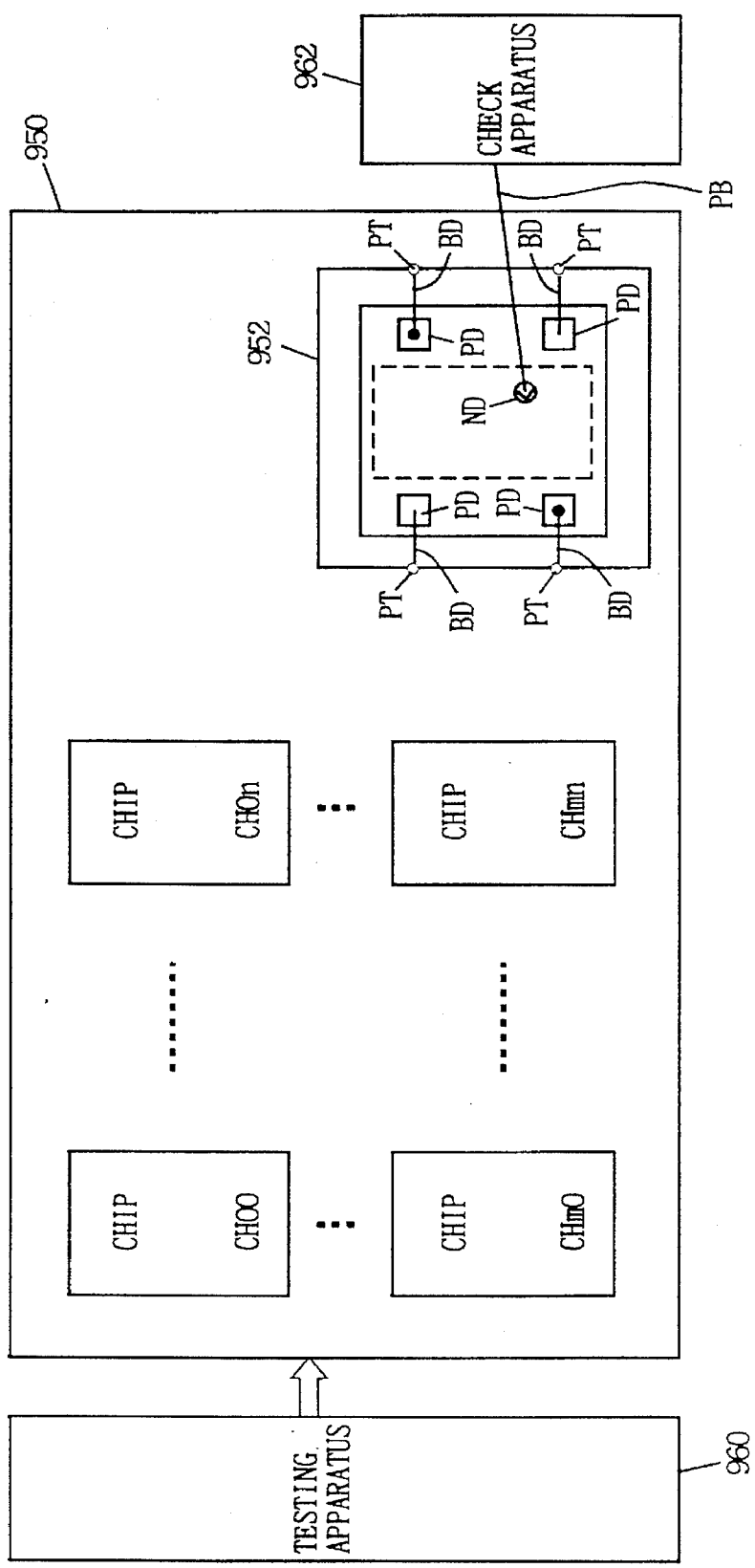
FIG. 23 is a diagram showing an on-test arrangement of the conventional semiconductor device.

FIG. 2 is a diagram showing the structure of a principal part of a semiconductor device according to a first embodiment of the present invention. In FIG. 2, the semiconductor device includes an internal voltage down converter 910 as an inner circuit, for generating an internal power source voltage VCI, and an internal power source voltage utilizing circuit 912 operating with internal power source voltage VCI as an operating power source voltage which in turn is supplied from internal voltage down converter 910. The internal voltage down converter 910 and the internal power source voltage utilizing circuit 912 are identical in structure to those shown in FIG. 21. Components corresponding to those shown in FIG. 21 are identified by like reference numerals and their description will therefore be omitted.

The semiconductor device further includes an n channel MOS transistor 20 which is provided between a power pad 10 supplied with an external power source voltage VCE and a ground pad 12 supplied with a ground voltage VSS and which is adapted to form a current path in response to a burn-in mode designation signal BI. In FIG. 2, the n channel MOS transistor 20 is coupled to the power pad 10 through a power source line 905. One conducting terminal (drain) of the MOS transistor 20 may be connected directly to the power pad 10 through an interconnection line different from the power source line 905. The other conducting terminal (source) of the MOS transistor 20 may be connected to the ground pad 12 through an interconnection line different from a ground line 907. Alternatively, the other conducting terminal of the MOS transistor 20 may be connected to the ground pad 12 through the ground line 907. The operation of the semiconductor device will now be described with reference to FIG. 3.

In the normal operation of the semiconductor device, the burn-in mode designation signal BI is at "L" indicative of an inactive state and MOS transistor 928 and MOS transistor 20 are both in an off state. Under this condition, no current flowing path is formed between the power pad 10 and the ground pad 12. When the internal power source voltage utilizing circuit 912 or a non-illustrated external power source voltage utilizing circuit such as an input/output buffer is activated, a path through which a current I0 flows, may be formed between the power pad 10 supplied with the external power source voltage VCE and the ground pad 12 (e.g., a path through which a current consumed in the semiconductor memory device flows upon its standby). When the burn-in mode designation signal BI is at "L" indicative of the inactive state, the internal power source voltage VCI outputted from the internal voltage down converter 910 is maintained at a level of a reference voltage Vref generated from a reference voltage generator 922 by a comparator 926 and a drive transistor 924.

When the burn-in test is to be performed, the burn-in mode designation signal BI is set to an "H" indicative of an active state. A structure may be utilized in which the burn-in mode designation signal BI is supplied directly from the outside. The burn-in mode designation signal BI may, alternatively, be generated internally in accordance with timings of a plurality of external control signals. Further, the burn-in mode designation signal BI may be generated according to a combination of states of both external control signals and a signal supplied to a specific address signal input pin. Still further, the burn-in mode designation signal BI may be generated based on a so-called "Super Vcc" setting a voltage applied to a specific pin terminal to be greater than that at the time of the normal operation. When the burn-in mode designation signal BI is brought to the "H" indicative of the active state, the MOS transistor 928 is turned on so that a node 929 of the internal voltage down converter 910 is set to a ground voltage VSS level. Thus, the drive transistor 924 is completely turned on so that the internal power source voltage VCI on an inner power source line 909 becomes equal to the external power source voltage VCE supplied to the power pad 10, thereby making it possible to vary the internal power source voltage VCI in accordance with the external power source voltage VCE.

At this time, the MOS transistor 20 serving as a current path forming means is turned on in response to the burn-in mode designation signal BI that is "H" in level, so that a current path is formed between the power pad 10 and the ground pad 12. Since the MOS transistor 20 has its own inherent on resistance, an additive current Ia is generated in addition to the consumption current I0 generated by the internal power source voltage utilizing circuit 912 and non-illustrated other external power source voltage utilizing circuit or the like included in the semiconductor memory device. When the additive current Ia is externally detected, it is externally identified that the MOS transistor 20 is turned on and the current path has been formed between the power pad 10 and the ground pad 12. When the MOS transistor 20 is brought into an on state, the MOS transistor 928 included in the internal voltage down converter 910 is turned on. It is thus possible to externally identify that the internal power source voltage VCI outputted from the internal voltage down converter 910 has been set to a state in which it can be varied according to the external power source voltage VCE.

If the additive current Ia supplied from the MOS transistor 20 is of the order of mA, as the current I0 supplied upon standby of the semiconductor memory device is extremely slight (In the case of the semiconductor memory device, the standby current is of the order of μA). it is thus possible to easily identify whether or not the MOS transistor 20 is in the on state, i.e., the current path has been formed between the power pad 10 and the ground pad 12.

Figure 3:
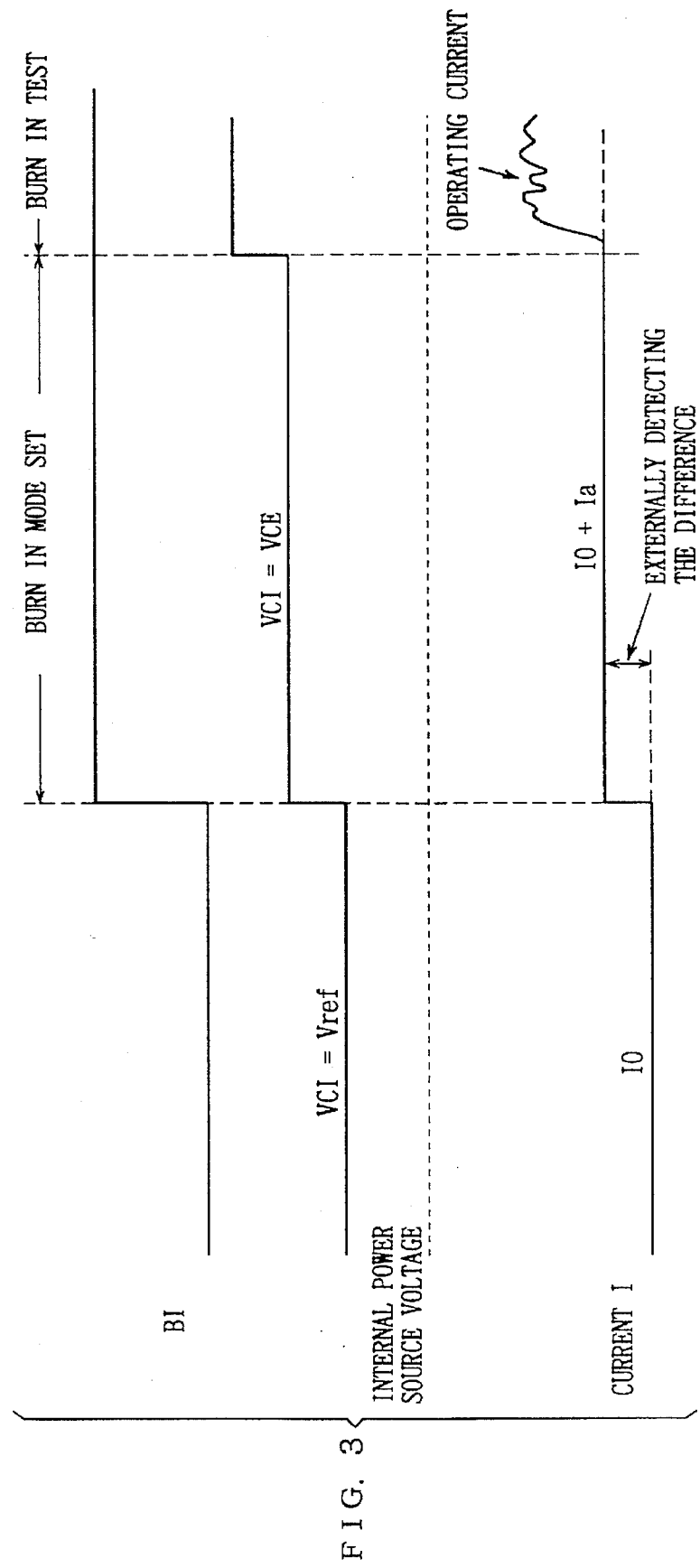
FIG. 3 is a signal waveform chart for indicating the operation of the semiconductor device shown in FIG. 2.

After the internal power source voltage VCI has become equal to the external power source voltage VCE based on the burn-in mode designation signal BI, the internal power source voltage VCI is set to a predetermined voltage level in accordance with the external power source voltage VCE. Next, the internal power source voltage utilizing circuit 912 is activated to execute the burn-in test. Upon this operation, the current is consumed by the MOS transistor 20 but is sufficiently small as compared with an operating current consumed upon operation of the semiconductor memory device. Further, since the MOS transistor 20 is interposed in a path different from the internal voltage down converter and not illustrated external power source voltage utilizing circuit or the inner circuit, the additive current Ia flowing in the MOS transistor 20 has no bad influence upon the operation of internal circuits and thus the burn-in test can be reliably executed. Incidentally, the current I shown in FIG. 3 represents the current that flows from the power pad 10 to the ground pad 12, i.e., the current consumed by the semiconductor device. Upon the operation of the semiconductor device, the operating current flowing under the operation of internal circuits is greater than the standby current I0.

First Modification

Figure 4:
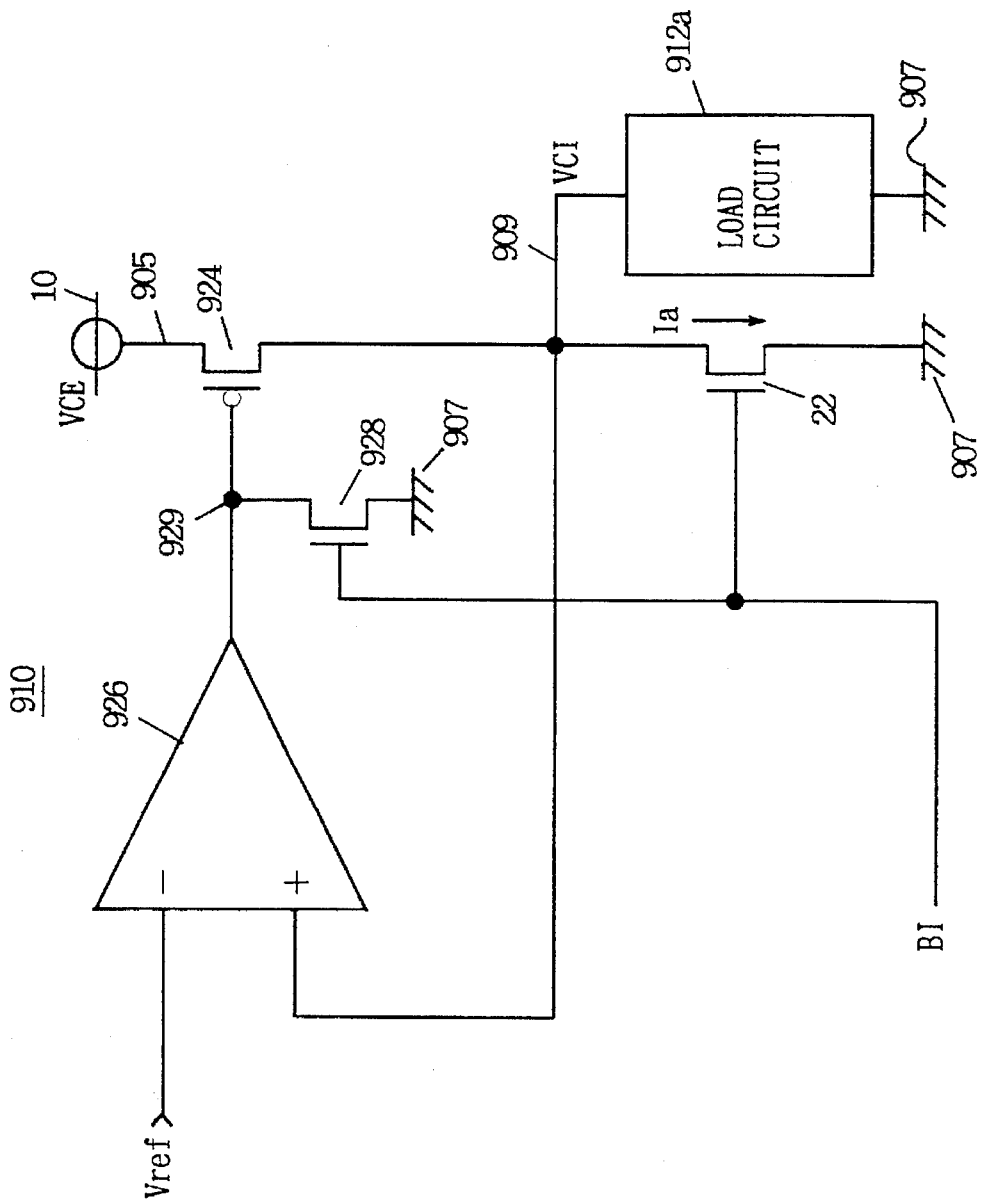
FIG. 4 is a diagram showing the structure of a first modification of the first embodiment of the present invention.

FIG. 4 is a diagram showing a first modification of the first embodiment. In the structure shown in FIG. 4, an n channel MOS transistor 22, which is brought conductive in response to a burn-in mode designation signal BI, is provided between an inner power source line 909 and a ground line 907. Other structures of the first modification are identical to those of a conventional semiconductor device shown in FIG. 21 and components corresponding to those shown in FIG. 21 are identified by like reference numerals.

Under the structure shown in FIG. 4, when the semiconductor device is in a normal operation mode, the n channel MOS transistor 22 is in an off state and an inner circuit such as a load circuit 912a consumes current.

When the burn-in mode designation signal BI is brought to "H", the inner power source line 909 is electrically connected to the ground line 907. If an on resistance of the MOS transistor 22 has a relatively large value, then a current flows from the inner power source line 909 to the ground line 907. The inner power source line 909 is supplied with a current from power pad 10 through drive transistor 924. The ground line 907 is coupled to a ground pad (not shown in FIG. 4). Thus, when the MOS transistor 22 is turned on, an additive current Ia flows from the power pad 10 to the ground pad. Node 929 of the semiconductor device is determined to be set to a ground potential level by externally detecting the additive current Ia, thereby making it possible to identify whether or not the semiconductor device is in a state of conducting the burn-in test. Even when the MOS transistor 22 is connected between the inner power source line 909 and the ground line 907, a current, which flows between the power pad 10 and the ground pad (not shown in FIG. 4) and is consumed by an internal circuit, is externally detected. Since a standby current increases when the MOS transistor 22 is in the conducting state, whether or not the semiconductor device has been set to a burn-in test enable state, can be easily identified in a manner similar to the structure shown in FIG. 2.

Second Modification

Figure 5:
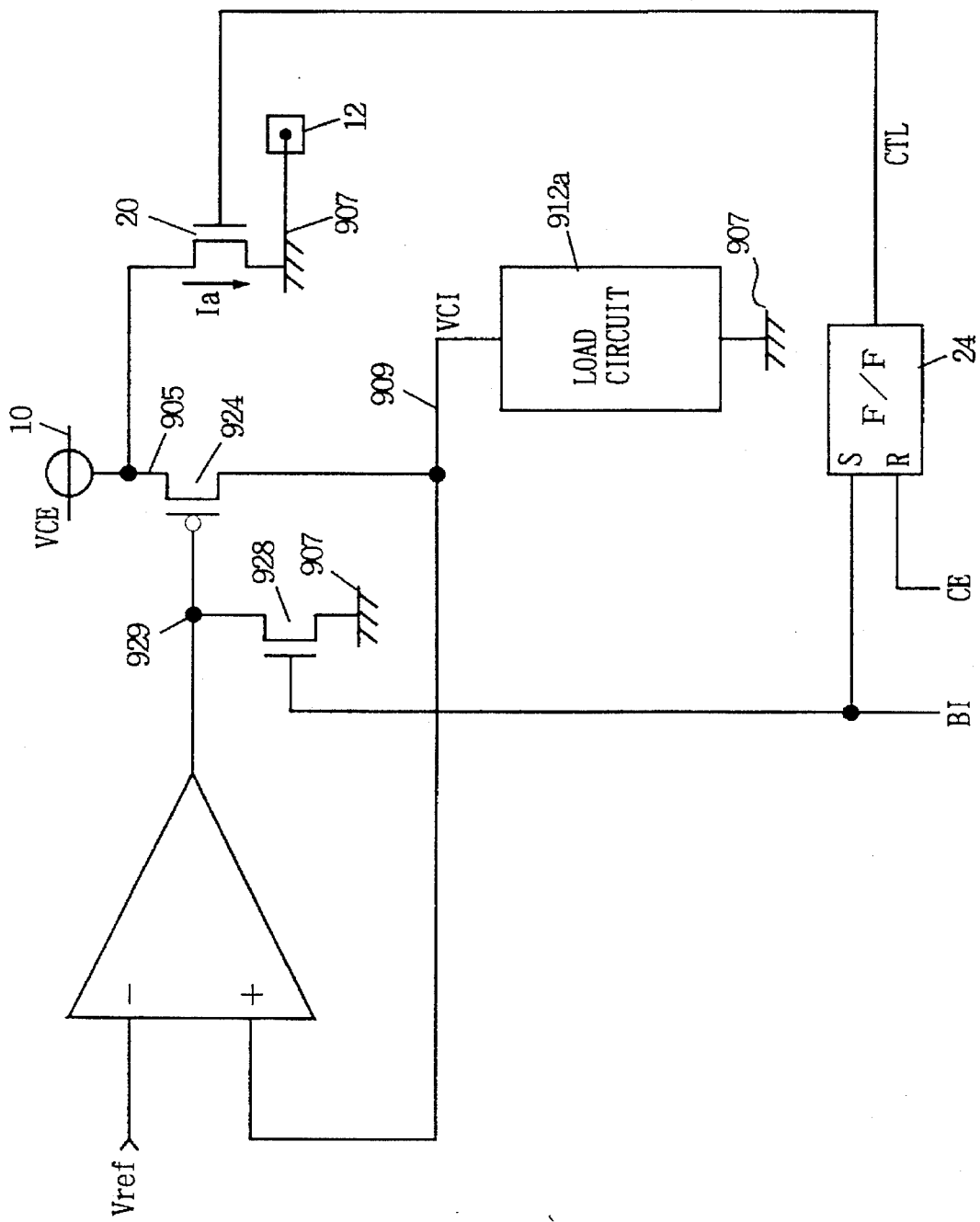
FIG. 5 is a diagram illustrating the structure of a second modification of the first embodiment of the present invention.

FIG. 5 is a diagram illustrating the structure of a second modification of the first embodiment of the present invention. In the structure shown in FIG. 5, a flip-flop (F/F) supplies a control signal CTL to the gate of an MOS transistor 20 for forming a current path between a power pad 10 and a ground pad 12. The flip-flop 24 is set upon activation of a burn-in mode designation signal BI to set the control signal CTL to an "H" indicative of an active state. Next, when a period designation signal CE such as a clip enable signal is brought to the "H" indicative of the active state, the flip-flop 24 resets the control signal CTL to an "L" indicative of an inactive state. The configuration of the flip-flop 24 will be described in detail later.

Figure 6:
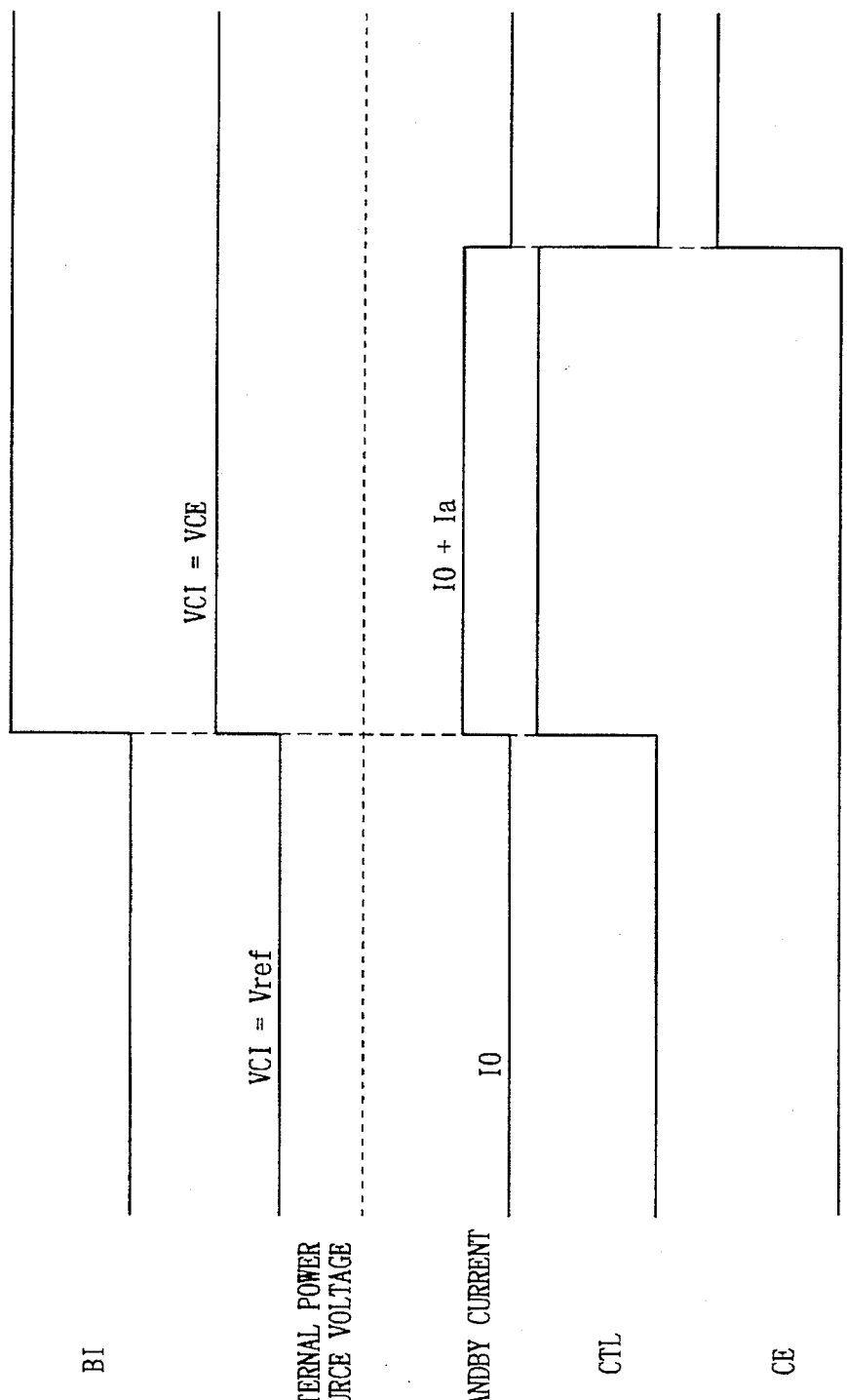
FIG. 6 is a signal waveform chart for indicating the operation of the semiconductor device shown in FIG. 5.

Referring to FIG. 5, the MOS transistor 20 is connected to the ground pad 12 through ground line 907. The MOS transistor 20 may be connected directly to the ground pad 12 through an interconnection line separate from the ground line 907. The operation of the second modification having the structure shown in FIG. 5 will now be described with reference to FIG. 6 which is an operation waveform chart thereof.

When a burn-in mode designation signal BI is at "L" indicative of the non-active state, the flip-flop 24 is in a reset state and the control signal CTL is "L" indicative of the inactive state. In this condition, the MOS transistor 20 is in an off state and a standby current having a magnitude determined based on a designation value flows in internal circuits (including an internal voltage down converter, an internal power source voltage utilizing circuit and an external power source voltage utilizing circuit) of the semiconductor device.

When a burn-in test is performed, the burn-in mode designation signal BI is set to the "H" indicative of the active state. In response to the burn-in mode designation signal BI at "H", the flip-flop 24 sets the control signal CTL to the "H" indicative of the active state so that the MOS transistor 20 is turned on. Thus, in the semiconductor device, an additive current Ia flows through the MOS transistor 20 to thereby increase a standby current. When the level of an external power source voltage VCE is raised substantially simultaneously with the input of the burn-in mode designation signal BI, there is a possibility of the standby current increasing correspondingly. However, if the standby current flowing in each internal circuit is of µA or so even when the level of the external power source voltage VCE rises and if the level of the additive current Ia is of a mA level, whether or not the current path has been formed inside the semiconductor device, can be reliably identified from the outside even if the level of the external power source voltage VCE is raised.

In order to perform the burn-in test, the semiconductor device is first supplied with control signals or the like from the outside and is then activated. In this condition, the chip enable signal CE serving as the period designation signal is brought to the "H" indicative of the active state. In response to the chip select enable signal CE which is "H" in level, the flip-flop 24 resets the control signal CTL to the "L" indicative of the inactive state to turn off the MOS transistor 20. As a result, a current path through which the additive current Ia flows, is cut off.

By causing the additive current Ia to flow only for a required period by using the period designation signal CE such as the chip select signal or the chip enable signal as described above, the current consumed upon the burn-in test can be reduced. In addition, a current measuring period can be externally established, and it becomes possible to identify at an appropriate timing whether or not the current path has been formed, that is, the internal state of the semiconductor device has been set to a predetermined state.

When the semiconductor device is under the normal operation, the burn-in mode designation signal BI is at "L" indicative of the inactive state even if the chip enable signal CE is brought to the "H" indicative of the active state. Accordingly, the control signal CTL generated from the flip-flop 24 is maintained at a potential level corresponding to the "L" indicative of the inactive state. As a result, the additive current Ia at the time of the normal operation can be reliably prevented from being generated.

As the flip-flop 24, a reset priority type set/reset flip-flop can be used in which a set input S is supplied with the burn-in mode designation signal BI, a reset input R is supplied with the chip enable signal CE and an the reset input R is sufficiently greater in drivability than the set input S. Other structures may also be utilized as the flip-flop 24. Structures, which are available as the flip-flop, will hereinafter be described in brief.

Flip-Flop 1

Figure 7:
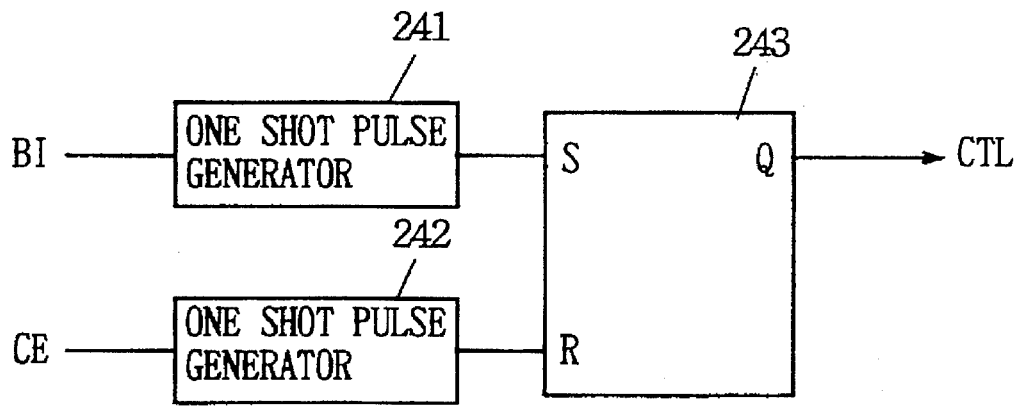
FIG. 7 is a diagram showing one example of the structure of a flip-flop shown in FIG. 5.

FIG. 7 is a diagram showing one example of the structure of the flip-flop shown in FIG. 5. In FIG. 7, the flip-flop 24 includes a one-shot pulse generator 241 for generating a one-shot pulse signal having a predetermined time width in response to the leading (rising) edge of burn-in mode designation signal BI, a one-shot pulse generator 242 for generating a one-shot pulse signal having a predetermined time width in response to the leading edge of chip enable signal CE and a set/reset flip-flop 243 having a set input S supplied with the output of the one-shot pulse generator 241 and a reset input R supplied with the output of the one-shot pulse generator 242. A control signal CTL is generated from an output Q of the flip-flop 243.

In the structure of the flip-flop shown in FIG. 7, the set/reset flip-flop 243 is set in response to the leading edge of the burn-in mode designation signal BI so that the control signal CTL produced from the output Q is brought to the "H" indicative of the active state. When the chip enable signal CE rises to the "H", the set/reset flip-flop 243 is reset so that the control signal CTL outputted from the output Q is set to the "L" indicative of the inactive state. By making use of the structure shown in FIG. 7, the chip enable signal CE is brought to the "H" indicative of the active state when the burn-in mode designation signal BI is "L" indicative of the inactive state upon the normal operation, thereby making it possible to reliably maintain the control signal CTL at the "L" level.

Flip-Flop 2

Figure 8:
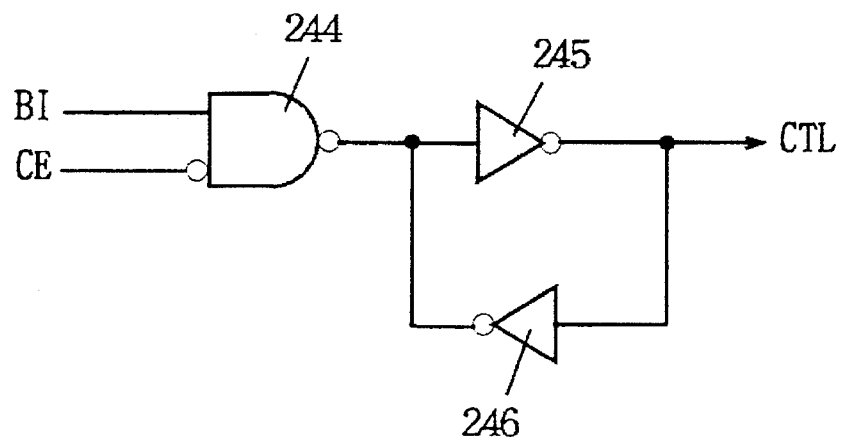
FIG. 8 is a diagram illustrating another example of the structure of the flip-flop shown in FIG. 5.

FIG. 8 is a diagram showing another example of the configuration of the flip-flop shown in FIG. 5. In the configuration shown in FIG. 8, the flip-flop 24 includes a gate circuit 244 having a true input supplied with burn-in mode designation signal BI and a false input supplied with chip enable signal CE, an inverter 245 for inverting the output of the gate circuit 244 and an inverter 246 for inverting the output of the inverter 245 and supplying the inverted output to the input of the inverter 245. A driving ability of the inverter 245 is set greater than that of the inverter 246. The inverter 245 generates control signal CTL therefrom. Only when the burn-in mode designation signal BI is "H" in level and the chip enable signal CE is "L" in level, the gate circuit 244 outputs a signal which is "L" in level.

In the configuration shown in FIG. 8, a latch circuit composed of the inverters 245 and 246 is used. Only when the burn-in mode designation signal BI is brought into an active state and the chip enable signal CE is being "L" indicative of the inactive state, the control signal CTL can be set to the "H" indicative of the active state, also in the structure shown in FIG. 8. In the normal operating mode in which the burn-in mode designation signal BI is maintained at an inactive state, the control signal CTL is normally set to the "L". Thus, the structure shown in FIG. 8 can also be used as the flip-flop 24.

According to the structure of the first embodiment, as has been described above, the switching element forms the current path between the power pad and the ground pad in response to the burn-in mode designation signal. Therefore, whether or not the semiconductor device has been set to the burn-in test enable state can be easily determined by externally detecting the current flowing through the power pad and the ground pad. Since the power pad and the ground pad are used in this case, it is unnecessary to use additional pads in order to detect the internal state of the semiconductor device. Further, the internal state of the semiconductor device can be easily identified from the outside without providing a complex structure.

By causing the additive current to flow only for the predetermined period as in the case of the second modification in particular, the additive current can be generated only for the internal-state determination period, thereby making it possible to reduce the unnecessary current consumption.

As the period designation signal, signals such as a chip select signal, a row address strobe signal, etc. may be used as well as the chip enable signal. Any signal for designating the standby and operating states of the semiconductor device could be used as the period designation signal.

Second Embodiment

Figure 9:
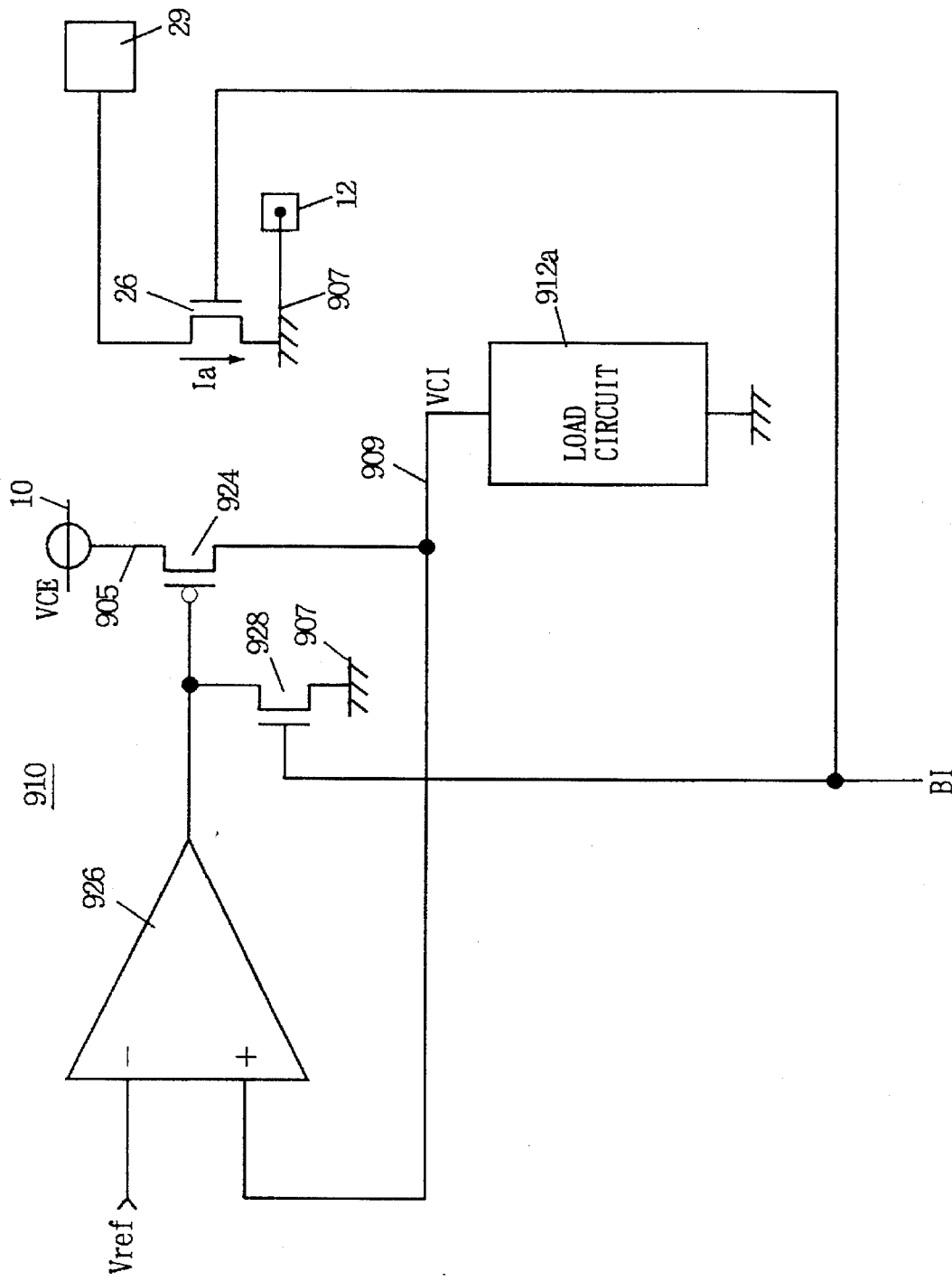
FIG. 9 is a diagram depicting the structure of a principal part of a semiconductor device according to a second embodiment of the present invention.

FIG. 9 is a diagram showing the structure of a principal part of a semiconductor device according to a second embodiment of the present invention. In the semiconductor device shown in FIG. 9, an n channel MOS transistor 26 is provided as a current path forming means between a pad 29 different from power pad 10 and ground pad 12 and is brought into an on state in response to a burn-in mode designation signal BI. The MOS transistor 26 is shown as connected to the ground pad 12 through ground line 907. However, the MOS transistor 26 may be constructed so as to be connected to the ground pad 12 through an interconnection line different from the ground line 907.

When the burn-in mode designation signal BI is "L" in level, the MOS transistor 26 is turned off. In this condition, no current path is formed between the pad 29 and the ground pad 12. When the burn-in mode designation signal BI is brought to an "H" indicative of an active state, the MOS transistor 26 is turned on so that a current flowing path is formed between the pad 29 and the ground pad 12. When a voltage of a desired level is applied to the pad 29, an additive current Ia flows through the MOS transistor 26. The value of the additive current Ia is determined based on an inherent on-resistance of the MOS transistor 26. In the second embodiment shown in FIG. 9, different from the first embodiment, it is unnecessary to identify the standby current (current flowing through the power pad upon standby: current consumed upon standby) and the additive current Ia. Specifically, whether or not an internal state of the semiconductor device has been set to a predetermined state can be determined by externally applying a voltage of a desired level to the pad 29 through an ammeter and identifying whether or not current is generated through the MOS transistor 26. The voltage applied to the pad 29 can be set independently of external power source voltage VCE and the additive current Ia flowing in the MOS transistor 26 can be set to a predetermined value, so that it is possible to accurately determine whether or not the internal state of the semiconductor device has been set to the predetermined state. Since the MOS transistor 26 is completely separated from internal circuits, the additive current Ia flowing in the MOS transistor 26 can be reliably prevented from exerting an influence on the internal circuits, thereby making it possible to accurately test the operation of each internal circuit.

A desired pad may be used as the pad 29. As an alternative, a non-used pad (reserved pad) may be utilized as the pad 29. It is unnecessary to additionally provide a pad for determining the internal state of the semiconductor device. Further, an increase in the area used for the determination of the internal state of the semiconductor state can be suppressed in conjunction with the structure where only one MOS transistor is used as a current path forming means. Even when a pin used for the input and output of a signal in a normal operation is utilized, the internal state of the semiconductor device can be identified from a comparison with an input leakage current at the time of its standby which in turn is determined based on a designation value.

First Modification

Figure 10:
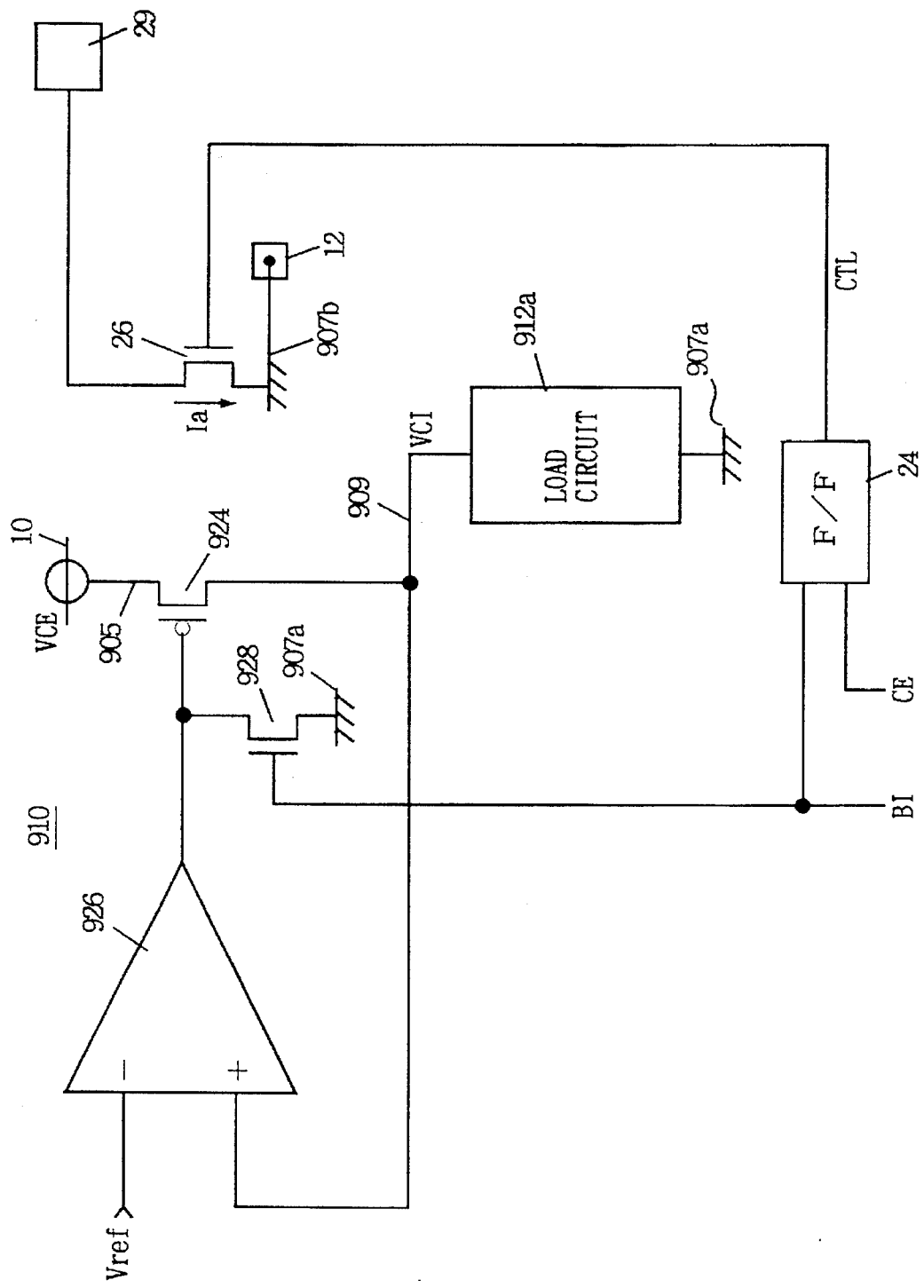
FIG. 10 is a diagram showing the structure of a first modification of the second embodiment of the present invention.

FIG. 10 is a diagram showing a first modification of the second embodiment of the present invention. In the configuration shown in FIG. 10, a control signal CTL is supplied to the gate of an n channel MOS transistor 26 serving as a current path forming means through a flip-flop 24. The flip-flop (F/F) 24 sets the control signal CTL to an "H" indicative of an active state in response to the leading edge (activation) of a burn-in mode designation signal BI and resets the control signal CTL to an "L" indicative of an inactive state in response to the leading edge (activation) of a chip enable signal CE as a period designation signal. The flip-flop 24 is identical in structure to that employed in the second modification of the first embodiment. In the structure shown in FIG. 10, a ground line 907b to which the n channel MOS transistor 26 is connected and a ground line 907a to which an internal-state setting n channel MOS transistor 928 included in internal voltage down converter 910 is connected, are shown being separate interconnection lines. The ground line 907b is connected to ground pad 12. The ground line 907a may be coupled to the ground pad 12 or a ground pad separate from the ground pad 12.

Even if a voltage for the supply of current is applied to a pad 29 in the structure shown in FIG. 10, when the chip enable signal CE is brought into an active state, and the semiconductor device is activated, the n channel MOS transistor 26 is turned off so that an additive current Ia is prevented from being generated. It is thus possible to reduce the current consumed for detecting whether or not the internal state of the semiconductor device has been set to a predetermined state.

According to the second embodiment, as has been described above, the current path is formed between a desired pad different from the power pad and the ground pad upon detection of the internal state of the semiconductor device. Therefore, the voltage level for identifying the presence or absence of the current can be set independently of the external power source voltage, and it is possible to determine accurately whether or not the current path has been formed. Since the current path for the identification of the internal state of the semiconductor device is formed so as to extend from the pad different from the power pad to the ground pad, the current path forming means can be prevented from exerting an adverse influence on the internal circuits (circuit using the external power source voltage VCE in particular). Further, the internal circuits can be stably operated in a test operation.

When the current flows through the current path only for the predetermined period based on the period setting signal, the current consumed for the identification of the internal state of the semiconductor device can be reduced.

Third Embodiment

Figure 11:
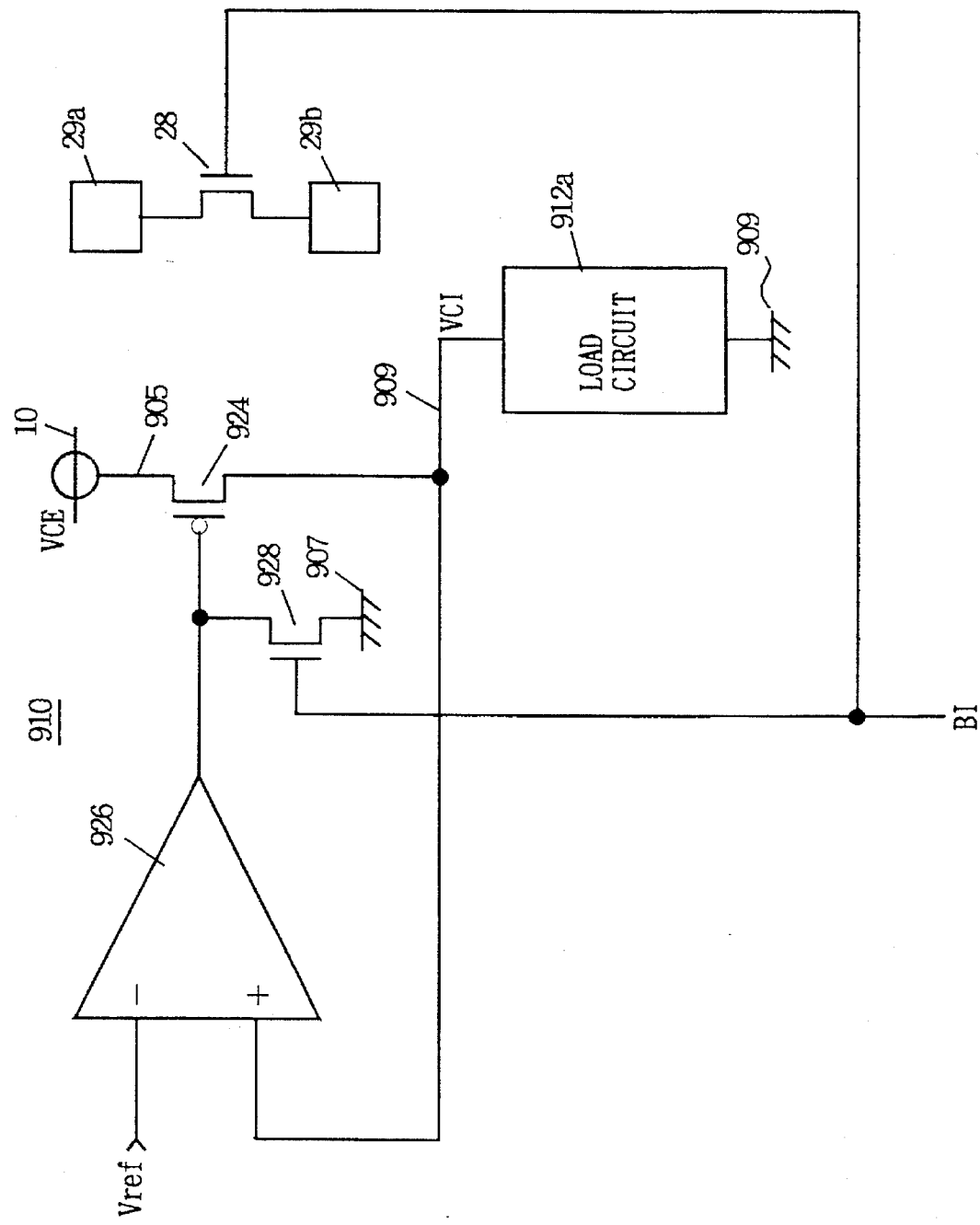
FIG. 11 is a diagram illustrating the structure of a semiconductor device according to a third embodiment of the present invention.

FIG. 11 is a diagram showing the structure of a principal part of a semiconductor device according to a third embodiment of the present invention. In the semiconductor device shown in FIG. 11, an n channel MOS transistor 28 brought into a conduction state in response to a burn-in mode designation signal BI is provided between desired pads 29a and 29b different from power pad 10 and a ground pad (shown in FIG. 11). An internal voltage down converter 910 and a load circuit 912a are identical in structure to those employed in the first and second embodiments.

When the burn-in mode designation signal BI is brought to an "H" indicative of an active state in the structure shown in FIG. 11, the n channel MOS transistor 28 is turned on so that the pads 29a and 29b are electrically connected to each other. If, at this time, the voltage is applied between the pads 29a and 29b from the outside, a current flows between the pads 29a and 29b due to an inherent on-resistance of the MOS transistor 28. Even if the on-resistance of the MOS transistor 28 is negligibly small, whether or not the current flows between the pads 29a and 29b can be determined outside the semiconductor device by externally connecting a resistor to either the pad 29a or 29b. Thus, the pads 29a and 29b may be short-circuited. When a voltage of a desired level is externally applied between the pads 29a and 29b, it is possible to identify whether or not the current flows through the n channel MOS transistor 28 when the burn-in mode designation signal BI is "H" in level. Accordingly, whether or not a transistor 928 included in the internal voltage down converter 910 is in an on state, can be identified.

Non-used pads can be used as the pads 29a and 29b. By making use of pads different from the power pad and the ground pad, a current path forming circuit for detecting an internal state of the semiconductor device can be completely separated from any internal circuit. Further, the current flowing in the current path forming circuit can be reliably prevented from exerting an adverse influence on internal circuits and hence the internal circuits can be stably operated under predetermined operating conditions, thereby making it possible to accurately test and determine the state of the internal circuits. For example, the current flowing in the current path forming circuit does not vary the ground potential of internal circuits because it does not flow into the ground line of the inner circuit.

By utilizing desired pads different from a power pad and a ground pad, it is unnecessary to provide an current-path forming switching element in the neighborhood of each of the power pad (or external power source line) and the ground pad (or ground line) on a chip of the semiconductor device. The switching element for the formation of the current path can be disposed within a desired vacant region on the chip of the semiconductor device. Further, an MOS transistor for the formation of the current path can be located in a desired position without exerting an influence on the layout of an internal circuit and without restrictions imposed on the position to be disposed.

First Modification

Figure 12:
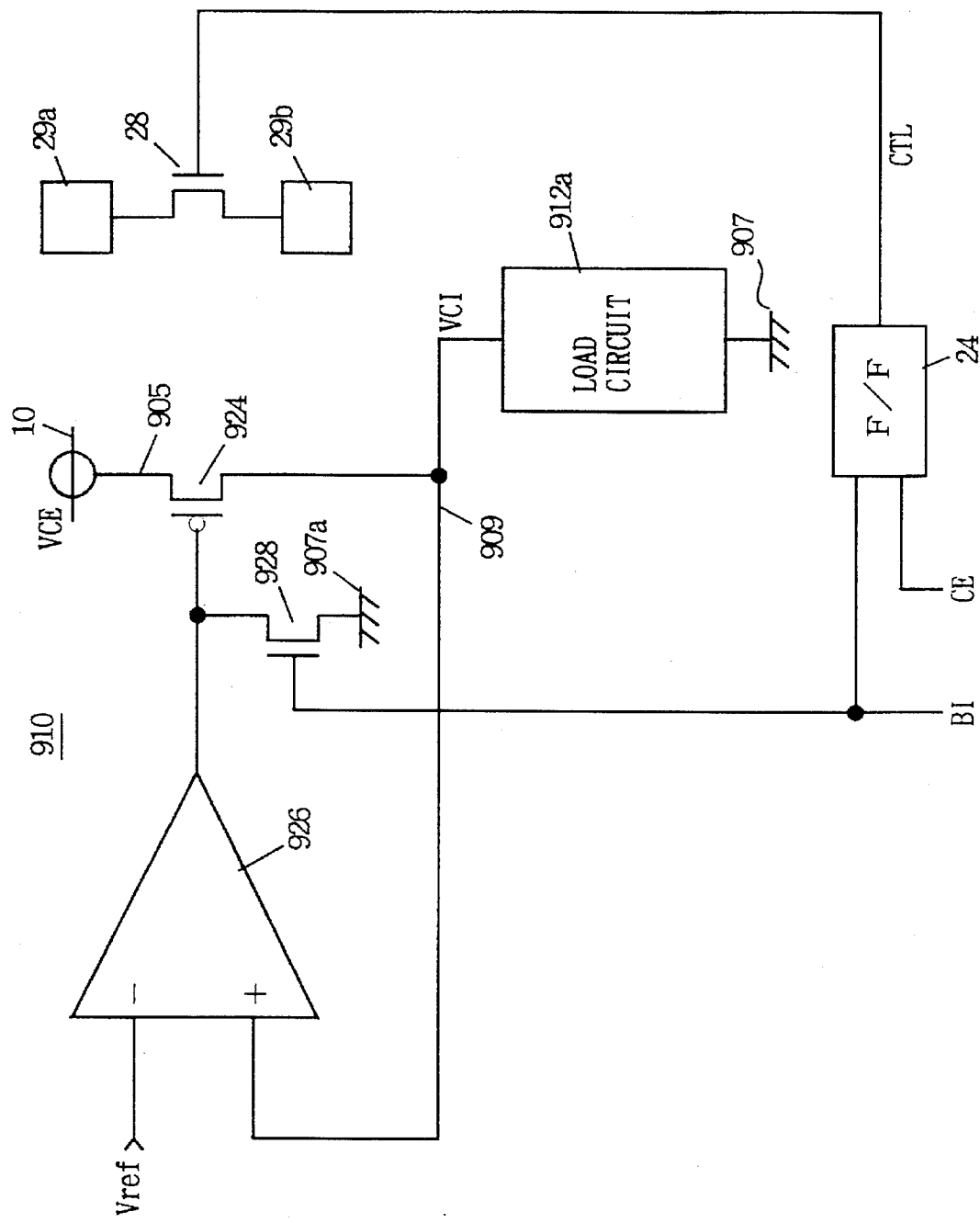
FIG. 12 is a diagram showing the structure of a first modification of the third embodiment of the present invention.

FIG. 12 is a diagram illustrating the structure of a first modification of the third embodiment of the present invention. In the structure shown in FIG. 12, a control signal CTL generated from a flip-flop (F/F) 24 is supplied to the gate of n channel MOS transistor 28 provided between pads 29a and 29b. The flip-flop 24 receives a burn-in mode designation signal BI and a chip enable signal CE as a period setting signal therein in a manner similar to the structures shown in the first and second embodiments. The flip-flop 24 is identical in operation to those shown in the first and second embodiments. The flip-flop 24 sets the control signal CTL to an "H" indicative of an active state in response to the leading edge of the burn-in mode designation signal BI and resets the control signal CTL to an "L" indicative of an inactive state in response to the leading edge of the chip enable signal CE. Other structures are identical to those shown in FIG. 11.

In the structure shown in FIG. 12, only when the burn-in mode designation signal BI is "H" indicative of an active state and the semiconductor device is in a standby state, a current path is formed between the pads 29a and 29b. When the semiconductor device enters an access cycle in response to the chip enable signal CE, the pads 29a and 29b are electrically separated from each other. Accordingly, pads (pads each supplied with an external signal or data) can be used for the detection of an internal state of the semiconductor device. Thus, even when non-used reserved pads are not prepared, desired pads can be used for the formation of the current path for detecting an internal state of the semiconductor device. It is therefore unnecessary to provide new pads for the detection of the internal state, thereby making it possible to prevent a chip area of the semiconductor device from increasing.

Since the current path is formed between the pads 29a and 29b only for a predetermined period (only when the chip enable signal CE is "L" indicative of the inactive state and the burn-in mode designation signal BI is "H" indicative of the active state), the current flows between the pads 29a and 29b only for a required period. Accordingly, the amount of current consumed for the detection of the internal state can be reduced.

According to the third embodiment, as described above, since the current path for detecting the internal state of the semiconductor device is formed using the desired pads, it is unnecessary to additionally provide dedicated pads for the detection of the internal state, and therefore an increase in the chip area of the semiconductor device can be suppressed. Since the current path forming circuit and internal circuits are completely separated from each other, an influence exerted on the operation of the internal circuits can be reliably eliminated upon activation of the current path forming circuit so as to allow the internal circuits to operate under predetermined operating conditions, thereby making it possible to reliably determine the state of operation of the internal circuits.

Fourth Embodiment

Figure 13:
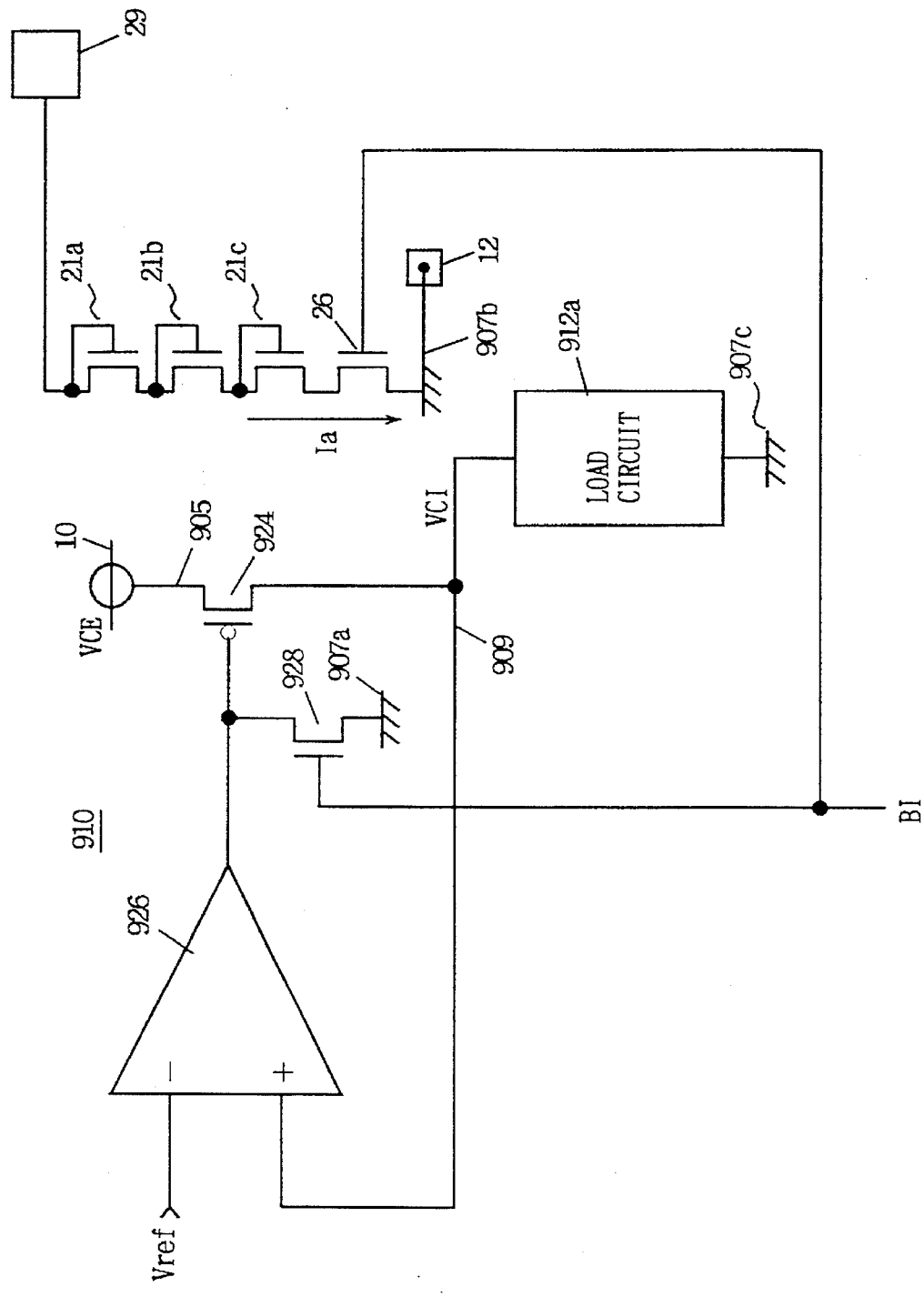
FIG. 13 is a diagram depicting the structure of a principal part of a semiconductor device according to a fourth embodiment of the present invention.

FIG. 13 is a diagram showing the structure of a principal part of a semiconductor device according to a fourth embodiment of the present invention. In the structure shown in FIG. 13, diode-connected n channel MOS transistors 21a, 21b and 21c and an n channel MOS transistor 26 whose gate is supplied with a burn-in mode designation signal BI, are series-connected between a desired pad 29 different from power pad 10 and ground pad 12. In the structure shown in FIG. 13, a transistor 928 included in the voltage down converter 910 is connected to a ground line 907a, whereas an MOS transistor 26 for the formation of a current path is connected to the ground pad 12 through a ground line 907b. A load circuit 912a is shown being connected to a ground line 907c. These ground lines 907a, 907b and 907c may be interconnection lines different from each other. Alternatively, they may be the same interconnection line.

When the burn-in mode designation signal BI is "L" indicative of an inactive state, the MOS transistor 26 is turned off regardless of the level of a voltage applied to the pad 29. When the burn-in mode designation signal BI is brought to an "H" indicative of an active state (the potential level of "H" may be either internal power source voltage VCI level or external power source voltage VCE level), a voltage is applied to the pad 29. The MOS transistors 21a, 21b and 21c each are diode-connected and cause a voltage drop of threshold voltage Vth. Thus, when the voltage applied to the pad 29 is more than or equal to the voltage drop 3·Vth developed by the MOS transistors 21a through 21c, the MOS transistors 21a through 21c are all turned on so that an additive current Ia flows through the n channel MOS transistor 26. In other words, only when the voltage applied to the pad 29 reaches a predetermined voltage level or more, the additive current Ia flows through the MOS transistor 26. Therefore, even if the potential applied to the pad 29 varies due to noise or the like when a predetermined voltage is not applied to the pad 29, it is possible to reliably prevent the influence of the noise, and whether or not the additive current Ia is flowing according to an internal state (an on-state of the transistor 928), can be accurately identified, thereby implementing a highly reliable inner state determination.

The voltage level applied to the pad 29 can be set to a suitable value, based on the threshold voltage Vth of each of the MOS transistors 21a through 21c and/or the number of the MOS transistors 21a through 21c. It is only required that when a voltage higher than the voltage level applied to the semiconductor device upon a normal operation is applied to the pad 29, the additive current Ia is caused to flow in a current path forming circuit (transistors 21a through 21c and 26).

First Modification

Figure 14:
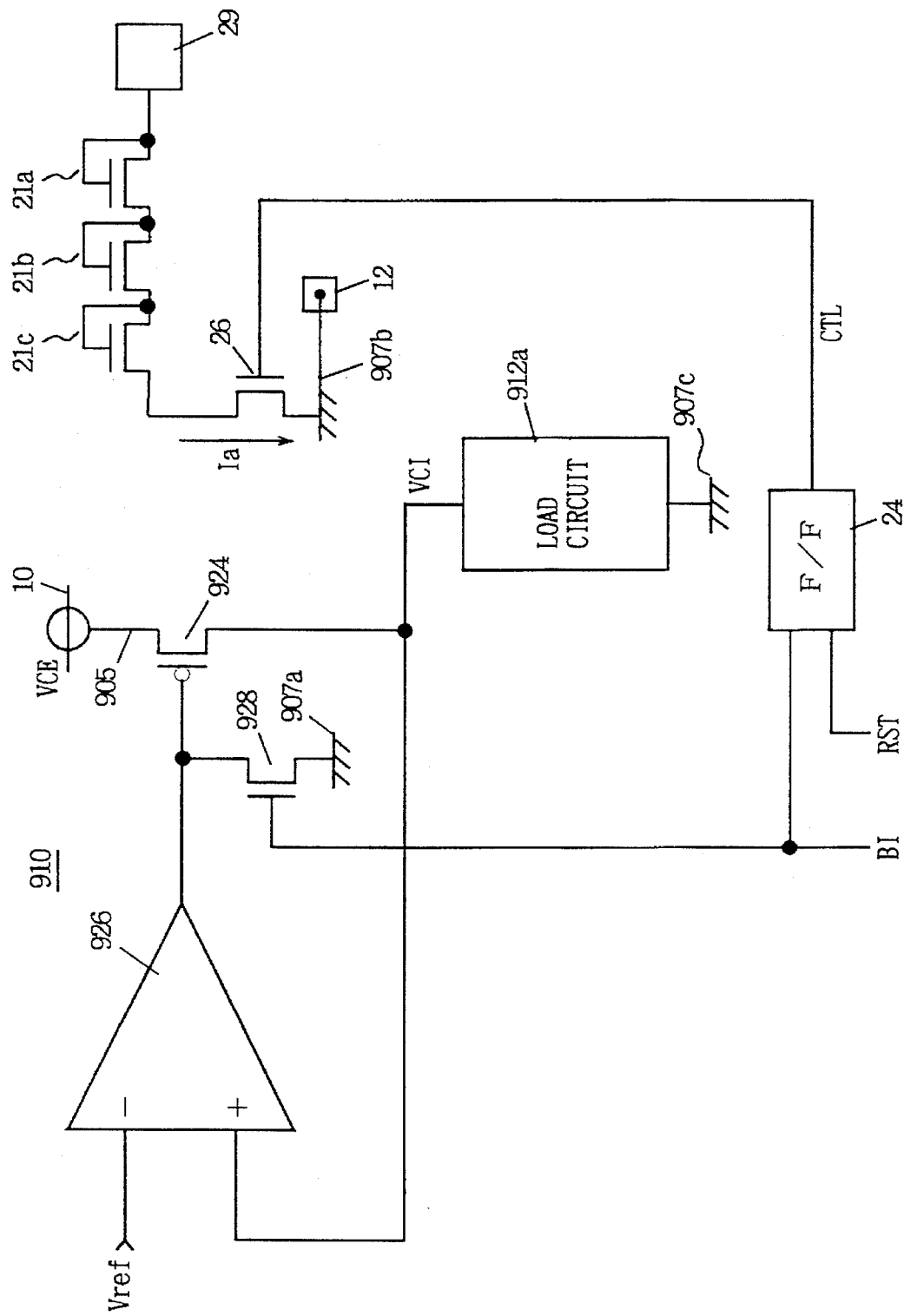
FIG. 14 is a diagram showing the structure of a first modification of the fourth embodiment of the present invention.

FIG. 14 is a diagram showing the structure of a first modification of the fourth embodiment of the present invention. In the structure shown in FIG. 14, a control signal CTL generated from a flip-flop 24 is supplied to the gate of MOS transistor 26 for the formation of a current path. Other structures are identical to those shown in FIG. 13 and components corresponding to those shown in FIG. 13 are identified by like reference numerals. The flip-flop 24 sets the control signal CTL to an "H" indicative of an active state in response to the leading edge (activation) of a burn-in mode designation signal BI and resets the control signal CTL to an "L" indicative of an inactive state in response to the leading edge (activation) of a reset signal RST. The chip enable signal CE described in the first through third embodiments may be used as the reset signal RST. Alternatively, a row address strobe signal RAS that defines a memory cycle in a dynamic type semiconductor memory device or the like, may be used as the reset signal RST. A chip select signal CS may be utilized as the reset signal RST. Further, a signal irrelevant to a memory access signal may be used as the reset signal RST. In this case, when it is determined outside the semiconductor device that an additive current Ia has flowed in a current path forming circuit, the reset signal RST is set to the "H" indicative of the active state. The mode of generating the reset signal RST may be arbitrary as far as the reset signal RST is of a signal for determining a period for detecting the additive current Ia flowing in the current path forming circuit.

According to the structure shown in FIG. 14, a period during which the MOS transistor is turned on, is determined based on the control signal CTL generated from the flip-flop 24. It is thus possible to cause the additive current Ia to flow only for a required period and to reduce a current consumed to detect an internal state of the semiconductor device. According to the operation of detecting the internal state, the control signal CTL generated from the flip-flop 24 can be brought into an inactive state/active state, thereby making it possible to realize an accurate internal-state determination operation (because the reset signal RST is simply brought into the active state after the internal state has been accurately set to a desired state).

Second Modification

Figure 15:
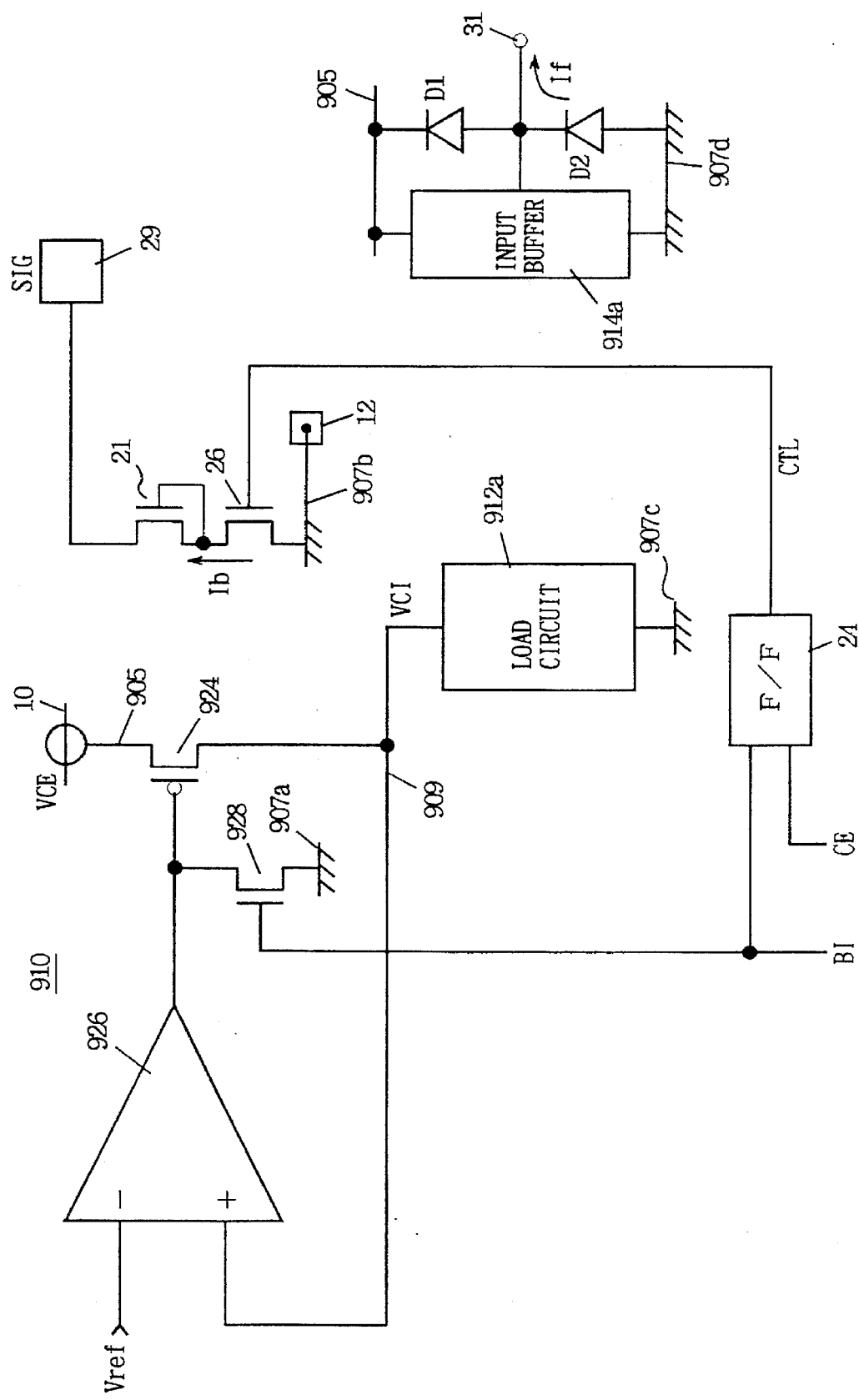
FIG. 15 is a diagram illustrating the structure of a second modification of the fourth embodiment of the present invention.

FIG. 15 is a diagram illustrating the structure of a second modification of the fourth embodiment of the present invention. In the structure shown in FIG. 15, an n channel MOS transistor 21 diode-connected in the forward direction from an n channel MOS transistor 26 is provided between the n channel MOS transistor 26 whose gate is supplied with control signal CTL generated from flip-flop 24 and a pad 29. One conducting terminal of the MOS transistor 26 is connected to pad 12 through ground line 907b. The ground line 907b may be identical to a ground line 907a connected to transistor 928 included in internal voltage down converter 910 and ground line 907c connected to load circuit 912a. Alternatively, the ground line 907b may be an interconnection line different from the ground lines 907a and 907c.

Figure 16:
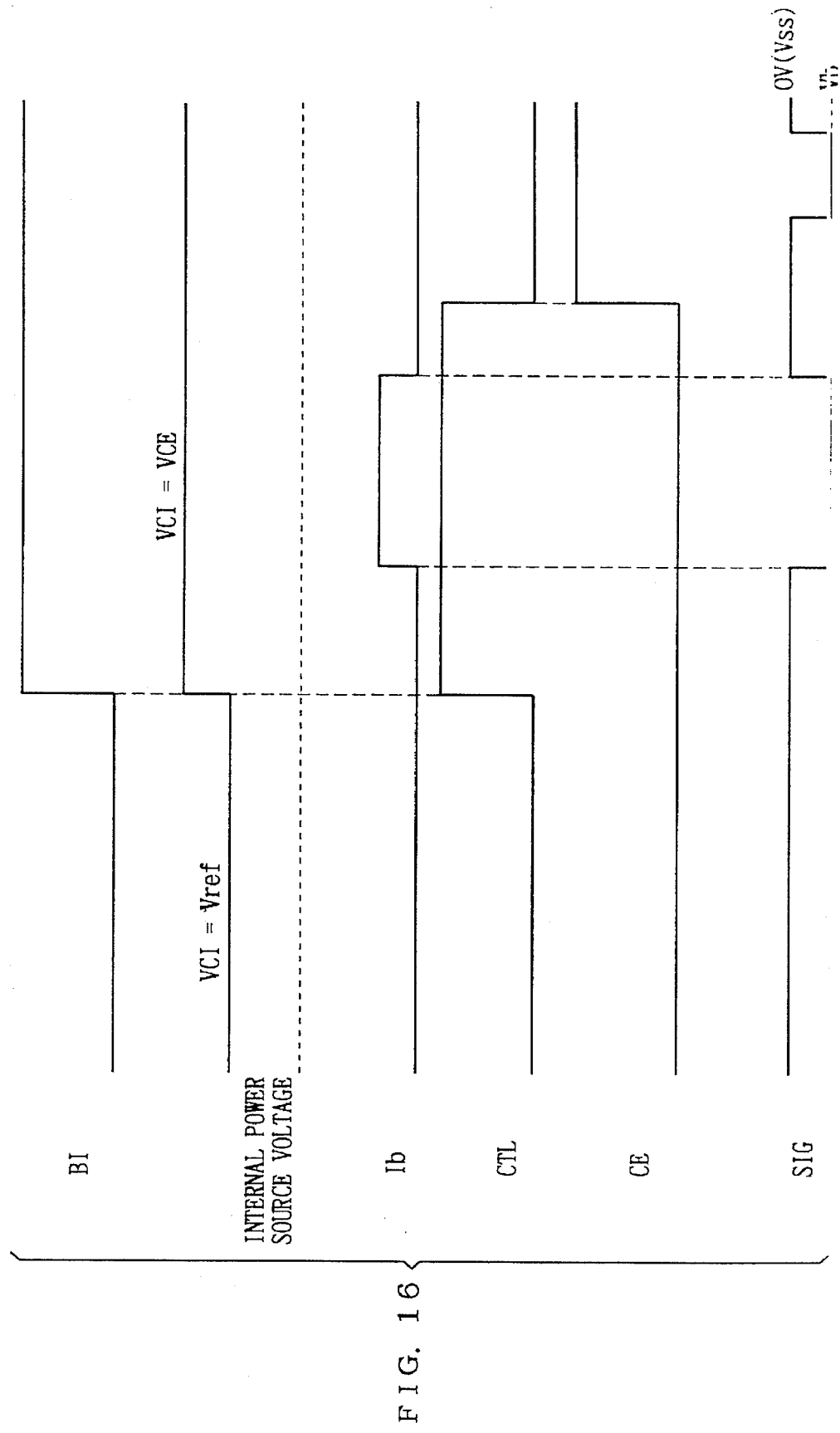
FIG. 16 is a signal waveform chart for indicating the operation of the semiconductor device shown in FIG. 15.

A voltage signal SIG brought to a negative potential level upon detecting a current is supplied to the pad 29. As shown in FIG. 15, input protection diodes D1 and D2 are generally provided between an input buffer 914a included in an input/output buffer and a signal input pad 31. The diode D1 is forwardly connected to a power source line 905 from the pad 31. The diode D2 is forwardly connected to the input pad 31 from a ground line 907d. The ground line 907d may be connected to the ground pad 12 or another ground pad. The input buffer 914a operates with power source voltage VCE on the power source line 905 and a ground voltage on the ground line 907d as operating power source voltages, to receive a signal from the outside. The diodes D1 and D2 are provided to prevent the influence of an overshoot and an undershoot of the signal supplied to the input pad 31 upon the input buffer 914a. When the level of the signal supplied to the input pad 31 reaches power source voltage VCE level or more, the diode D1 is brought into a conductive state so that the potential level of the signal supplied to the input pad 31 is reduced to the power source voltage VCE level. On the other hand, when the level of the signal supplied to the input pad 31 is reduced to a ground potential level or less (due to the undershoot), the diode D2 is brought into a conductive state to recover the potential on the input pad 31 to the ground voltage level. Thus, an unduly high or low voltage can be prevented from being applied to the input buffer 914a. In order to check whether or not the input protection diode D2 is normally operated, a test of applying a negative voltage to the input pad 31 and detecting an IF leakage current (If) that flows into the input pad 31 from the ground line 907d, is performed. The voltage signal SIG applied to the pad 29 uses the negative voltage employed in the IF leak test. The operation of the structure shown in FIG. 15 will be described below with reference to an operation waveform chart shown in FIG. 16.

When a burn-in mode designation signal BI is at "L" indicative of an inactive state, the control signal CTL generated from the flip-flop 24 is brought to the "L" indicative of the inactive state. In this condition, the MOS transistor 26 is in an off state and hence no current path is formed between the pad 29 and the ground pad 12.

When the burn-in mode designation signal BI is brought into an active state and chip enable signal CE is at "L" indicative of the inactive state, the control signal CTL generated from the flip-flop 24 is brought to an "H" indicative of an active state. As a result, the MOS transistor 26 is turned on. When the voltage signal SIG supplied to the pad 29 is at the ground potential level, the MOS transistor 21 is in an off state (the anode and cathode thereof are both identical in potential to each other) and a current Ib does not flow. When the voltage signal SIG is reduced to a predetermined negative potential Vb level in this state, the MOS transistor 21 is turned on so that an additive current Ib flows into the pad 29 from the ground pad 12. Whether or not the MOS transistor 928 included in the internal voltage down converter 910 is in the on state, can be identified by externally detecting the additive current Ib. It is thus possible to determine whether or not the semiconductor memory device has been set to a burn-in test enable state.

In the burn-in mode, internal power source voltage VCI is set equal to the external power source voltage VCE. In this state, the external power source voltage VCE is set to a predetermined voltage level, a burn-in test is executed. When the chip enable signal CE is brought to the "H" indicative of the active state, the control signal CTL generated from the flip-flop 24 is brought to the "L" indicative of the inactive state. When the control signal CTL is set to the "L" indicative of the inactive state, the MOS transistor 26 is turned off. Even if the voltage signal SIG supplied to the pad 29 is set to the negative potential Vb in this condition, a current does not flow through a path between the transistors 21 and 26, or only a negligible current Ib flows. In order to turn on both the transistors 21 and 26 to set the current Ib to a sensible current value when the control signal CTL is maintained at the ground voltage VSS level and the voltage signal SIG supplied to the pad 29 is at the negative potential Vb level, it is necessary to set a difference between the ground voltage VSS and the negative voltage Vb greater than the sum of threshold voltages of the transistors 21 and 26. Thus, if the negative potential Vb is at −Vth level, it is possible to sufficiently restrain the current Ib from flowing. Here, Vth represents the threshold voltage of the transistor 21.

In the structure shown in FIG. 15, the current flowing path can be formed by the current path forming circuit using the negative voltage applied to the input pad 31. Thus, the presence or absence of the current path can be identified without additionally providing a structure for generating a negative voltage to identify the current path, in a testing apparatus, thereby causing no complexity of the testing apparatus.

Only when the semiconductor device is set to the burn-in mode and is in the standby state, the current Ib flows by means of the flip-flop 24. If the value of the current Ib is sufficiently larger than a specification permissible value of the IF leakage current, then the pad 29 can be made in common with the input pad 31. It is thus unnecessary to provide a new pad to identify the internal state of the semiconductor device. In addition to a reduction in power consumption, an increase in the chip area of the semiconductor device can be avoided.

Further, since the control signal CTL is generated by the flip-flop 24 so as to determine a current path forming period, the current Ib can be generated only upon determination of the internal state, thereby causing no bad influence exerted on the IF leak test.

According to the fourth embodiment, as described above, since the current path is formed only when the voltage of the predetermined level is applied to one of the pads to which the current path forming circuit is connected, the semiconductor device can be prevented from malfunctioning due to the influence of noise or the like and the internal state of the semiconductor device can be accurately identified. Further, the pad to which the current path forming circuit is connected, can be used commonly by another circuit in the semiconductor device.

Fifth Embodiment

Figure 17:
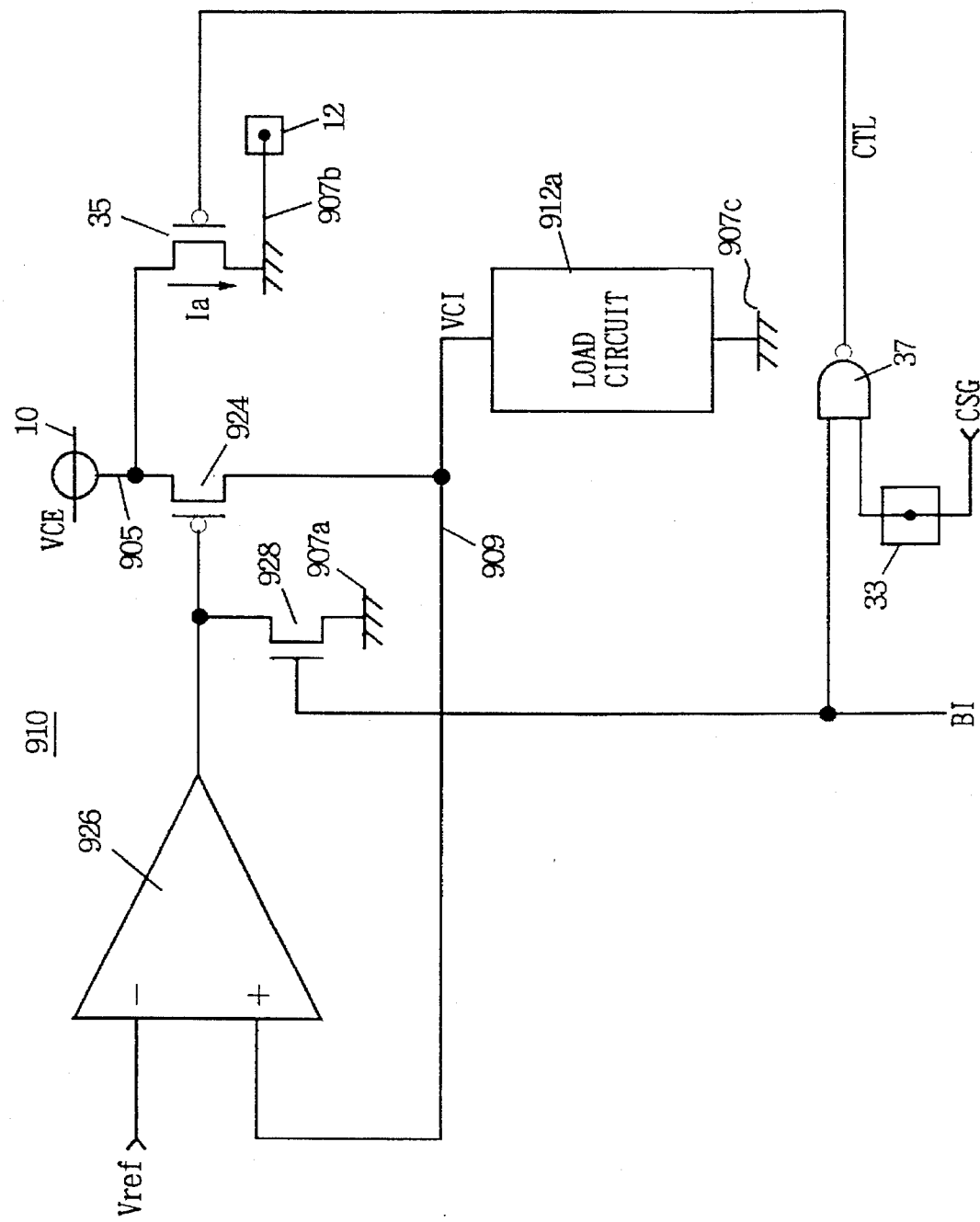
FIG. 17 is a diagram showing the structure of a principal part of a semiconductor device according to a fifth embodiment of the present invention.

FIG. 17 is a diagram showing the structure of a principal part of a semiconductor memory device according to a fifth embodiment of the present invention. In the structure shown in FIG. 17, a current path forming circuit includes a two-input AND circuit 37 which receives burn-in mode designation signal BI and a control signal CSG supplied from the outside through a pad 33, and an n channel MOS transistor 35 which is brought into a conduction state in response to a control signal CTL generated from the two-input AND circuit 37 to thereby electrically connect power pad 10 and ground pad 12 to each other. The MOS transistor 35 is connected to the ground pad 12 through ground line 907b. The ground line 907b may be an interconnection line identical to a ground line 907a connected to MOS transistor 928 and a ground line 907c connected to load circuit 912a or may be another interconnection line. The ground lines 907a and 907c may be connected to the ground pad 12 or another ground pad.

Other structures are identical to those of the internal voltage down converter 910 and the load circuit 912a described in the first through fourth embodiments referred to above. The operation of the semiconductor memory device will now be described. When the burn-in mode designation signal BI and the control signal CSG supplied from the outside are both brought to an "H", the two-input AND circuit 37 sets the control signal CTL to an "H" indicative of an active state. The MOS transistor 35 is brought into a conductive state in response to the set control signal CTL, so that the power pad 10 and the ground pad 12 are electrically connected to each other. By externally measuring a current flowing into the ground pad 12 from the power pad 10, identification can be made as to whether the internal voltage down converter 910 has been set to a predetermined state (i.e., a state in which internal power source voltage VCI has been made equal to external power source voltage VCE).

When at least one of the burn-in mode designation signal BI and the control signal CSG is brought to an "L", the control signal CTL outputted from the two-input AND circuit 37 is brought to an "L" indicative of an inactive state. Unlike the structure in which the chip enable signal CE or the like is used, the presence or absence of the current flow in the current path forming circuit can be identified independently of an operation situation of the semiconductor device by controlling a conducting period of the MOS transistor 35 using the control signal CSG supplied from the outside. Thus, when a burn-in mode is set, the MOS transistor 35 can be brought into a conducting state only for a period during which a current Ia is measured in a standby of the semiconductor device, thereby making it possible to more reduce the current consumed for the determination of such an internal state. When it is determined that the current Ia flows by a predetermined amount and the internal state has been set to the predetermined state, the control signal CSG may be set to an inactive state by an external testing apparatus in the setting of the burn-in mode.

If the current path is formed using a pad different from the power pad, whether or not has been reliably set to the burn-in mode and operated, can be externally identified, even when the internal circuits are being operated under execution of the burn-in test in the semiconductor device.

The structure of the fifth embodiment shown in FIG. 17 can apply to a structure including a flip-flops as in the first through fourth embodiments wherein AND gate 37 is used in place of the flip-flops. Namely, the MOS transistor 35 may be connected so as to form a current path between desired pads, although the MOS transistor 35 is connected so as to form the current path between the power pad 10 and the ground pad 12 in this embodiment. Alternatively, the MOS transistor 35 may be connected so as to form a current path between a desired pad and a ground pad. Further, the present structure may be used in combination with a structure in which a current path is formed only when a voltage greater than a predetermined voltage level is applied to a specific pad. Even when the present structure is combined with any structure, the current consumed for determining whether or not the semiconductor device has been set to the burn-in mode, can be reduced.

According to the structure of the fifth embodiment, as has been described above, since the period during which the current path is formed by the current path forming circuit, is externally controlled independently of the operating mode of the semiconductor device, the current path can be formed only for a required period, thereby making it possible to reduce the current consumed for determining the internal state.

Sixth Embodiment

Figure 18:
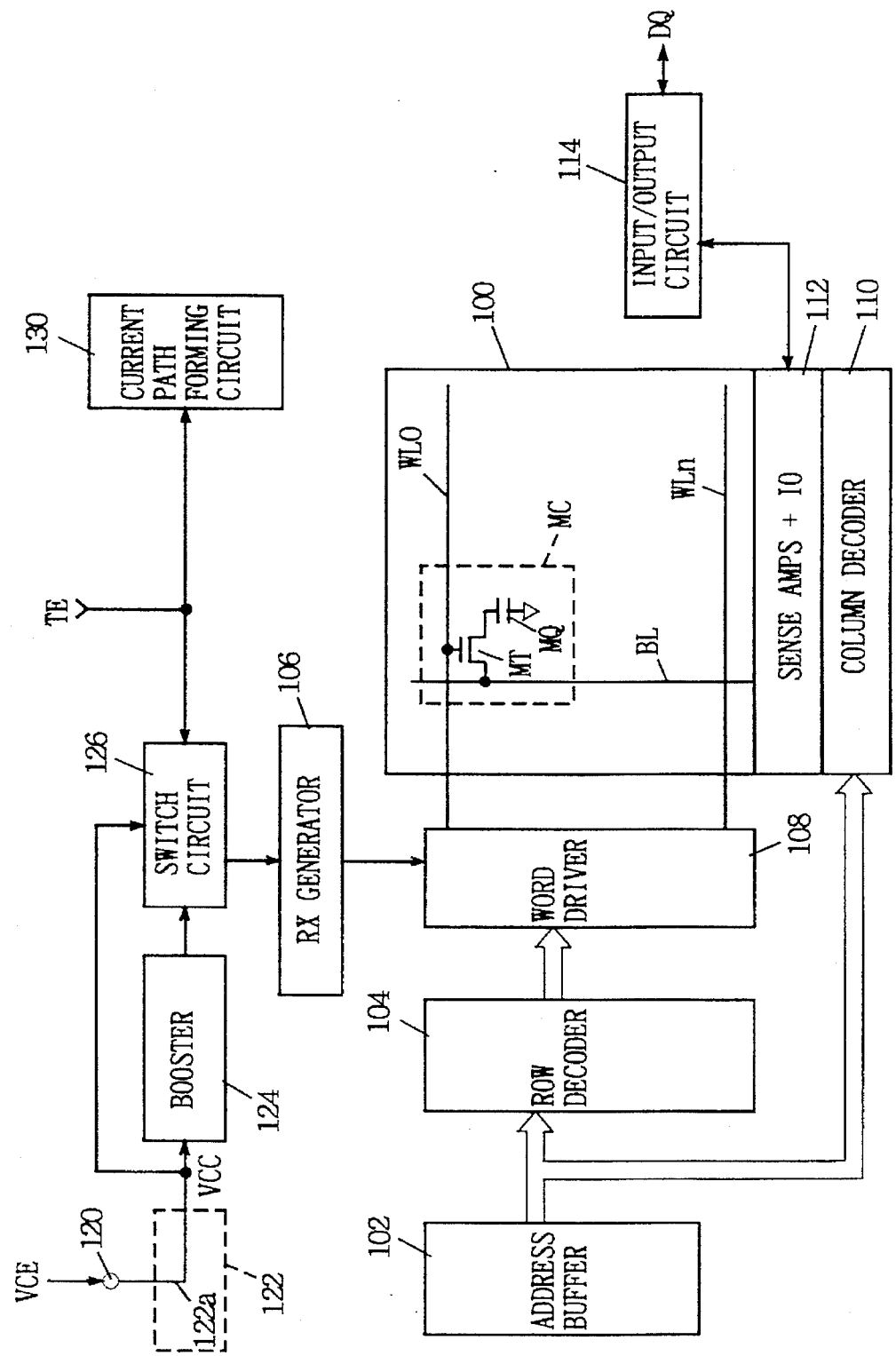
FIG. 18 is a diagram schematically illustrating the overall structure of a semiconductor device according to a sixth embodiment of the present invention.

FIG. 18 is a diagram schematically showing the overall structure of a semiconductor device according to a sixth embodiment of the present invention. The semiconductor device shown in FIG. 18 has a configuration of a dynamic random access memory as a semiconductor memory device. In FIG. 18, the semiconductor memory device includes a memory cell array 100 in which memory cells MCs are arranged in the form of a matrix of rows and columns. The memory cell array 100 includes word lines WL0 through WLn arranged corresponding to the respective rows of the memory cells MCs and bit lines BL (/BL) arranged corresponding to the respective columns of the memory cells MCs. In FIG. 18, the memory cell MC provided corresponding to a position where the word line WL0 and the bit line BL intersect, will be illustrated as a representative. The memory cell MC includes a memory capacitor MQ for storing information in the form of charges and a memory transistor MT for electrically connecting the memory capacitor MQ to a corresponding bit line (BL). The bit lines BL and /BL for transmitting signals complementary to each other are generally disposed in pair. In FIG. 18, only a single bit line BL is shown.

The semiconductor device further includes an address buffer 102 for generating an internal address signal in response to an address signal supplied from the outside, a row decoder 104 for decoding the internal row address signal supplied from the address buffer 102 and generating a signal for designating a corresponding word line in the memory cell array 100, and a word driver 108 for transmitting a word line drive signal RX supplied from an RX generating circuit 106 onto the selected word line in response to the word line designating signal generated from the row decoder 104. The RX generating circuit 106 generates the word line drive signal RX boosted to a level higher than the internal power source voltage VCI only upon selection of a word line and supplies it to the word driver 108.

Furthermore, the semiconductor device includes a column decoder 110 for decoding an internal column address signal generated from the address buffer 102 and generating a column selection signal for designating a corresponding column (bit line pair) in the memory cell array 100, sense amplifiers for detecting and amplifying data stored in memory cells connected to the word line selected in the memory cell array 100, and IO gates for electrically connecting the corresponding bit line pair to an input/output circuit 114 in response to the column selection signal supplied from the column decoder 110. In FIG. 18, the sense amplifiers and the IO gates are shown by a single block 112. The number of columns (bit line pairs) electrically connected to the input/output circuit 114 through the block 112 is determined depending on the number of bits of input/output data DQ.

The semiconductor device still further includes an internal power source voltage generating circuit 122 for generating an internal power source voltage VCC from an external power source voltage VCE through a power pad 120, a boosting circuit 124 for boosting the internal power source voltage VCC supplied from the internal power source voltage generating circuit 122, a switching circuit 126 for selecting one of the boosted voltage generated from the boosting circuit 124 and the internal power source voltage VCC in response to a test mode designating signal TE for transmission to the RX generating circuit 106, and a current path forming circuit 130 for forming a current path between specific pads (not shown in FIG. 18) in response to the test mode designation signal TE. As the configuration of the current path forming circuit 130, the structure described in each of the first through fifth embodiments can be utilized. Further, the test mode designation signal TE is used as an alternative to the burn-in mode designation signal BI.

The internal power source voltage generating circuit 122 is shown generating the internal power source voltage VCC from the external power source voltage VCE through an interconnection line or power line 122a connected to the power pad 120. As the internal power source voltage generating circuit 122, the internal voltage down converter employed in each of the first through fifth embodiments may be used. Since the internal voltage down converter is not so significant in the present semiconductor device, the internal power source voltage generating circuit 122 is represented so as to be composed of the power line 122a.

When the test mode designation signal TE is inactive to indicate a normal operating mode, the switching circuit 126 selects a boosted voltage from the boosting circuit 124 and supplies it to the RX generating circuit 106. The word driver 108 transfers the word line drive signal RX having the boosted level onto the word line selected based on the word line selection signal supplied from the row decoder 104. Each bit line BL (/BL) is set to power source voltage VCC level or ground voltage VSS level by the sense amplifier (included in the block 112) in accordance with the data stored in its associated memory cell.

By boosting a voltage level on a selected word line WL (any of the word lines WL0 through WLn) to a level higher than the power source voltage VCC level, the voltage of the power source voltage VCC level can be written into its associated memory capacitor MQ without affect of the threshold voltage of the corresponding memory transistor MT. Thus, even when the capacitance of the memory capacitor MQ is small, a sufficient amount of charges can be stored in the memory capacitor MQ. Although not shown explicitly, the bit line BL is set to a potential level equal to an intermediate potential (VCC+VSS)/2 between the power source voltage VCC and the ground voltage VSS upon standby. Upon selection of a memory cell, the voltage of the ground voltage VSS level or the power source voltage VCC level is supplied to the corresponding bit line BL (or /BL) from the memory capacitor MQ. Upon activation of the sense amplifiers, the amount of change in potential on each bit line is equally set relative to both an "H" level read voltage and an "L" level read voltage. By doing so, the operation of the sense amplifiers can be stabilized.

Writing of data into the selected memory cell or reading of data therefrom is performed in a manner similar to a normal semiconductor memory device. A desired column is selected from the memory cell array 100 by the column decoder 110 and the IO gates in the block 112. The input/ output circuit 114 writes data into the selected column and reads data therefrom.

When the test mode designation signal TE is brought into an active state, the switching circuit 126 selects the power source voltage VCC and supplies it to the RX generating circuit 106. Thus, the voltage level of the word line drive signal RX generated from the RX generating circuit 106 is brought to the power source voltage VCC level. The "H" voltage to be written into the selected memory cell MC is brought to VCC-Vth. Here, Vth represents the threshold voltage of the memory transistor MT. An acceleration test on a charge holding characteristic of the memory Cell MC is performed under the condition that the voltage written into the memory capacitor MQ is reduced.

At this time, the current path forming circuit 130 forms a current path between specific two pads in response to the test mode designation signal TE. Thus, whether or not the semiconductor device has been set to a predetermined test mode state, i.e., whether or not the voltage level of the word line drive signal RX generated from the RX generating circuit 106 has been set to the power source voltage VCC level, can be determined by externally measuring a current flowing in the current path forming circuit 130.

The structure of reducing the voltage level of the word line drive signal generated from the RX generating circuit 106 can be used not only for the evaluation of the charge holding characteristic of the memory cell MC but also for a test on an operating margin to the power source voltage used to determine whether or not the semiconductor device is accurately storing data therein upon change in the power source voltage VCC. The level of the boosted voltage generated from the boosting circuit 124 is determined based on the level of the power source voltage VCC (a charge pump circuit using a capacitor is generally used as the boosting circuit 124).

As one example of the semiconductor device, the structure is shown in which, in the semiconductor memory device, the switching circuit 126 selects either one of the boosted voltage generated from the boosting circuit 124 and the power source voltage VCC and supplies the selected one to the RX generating circuit 106. However, as far as the potential at an internal node is set to a predetermined potential level in accordance with the test mode designation signal TE, then the present invention can be applied to any structures.

According to the sixth embodiment, whether or not the semiconductor device has been set to a test mode different from the burn-in mode, can be easily identified from the outside, thus making it possible to accurately test the semiconductor device.

Figure 19:
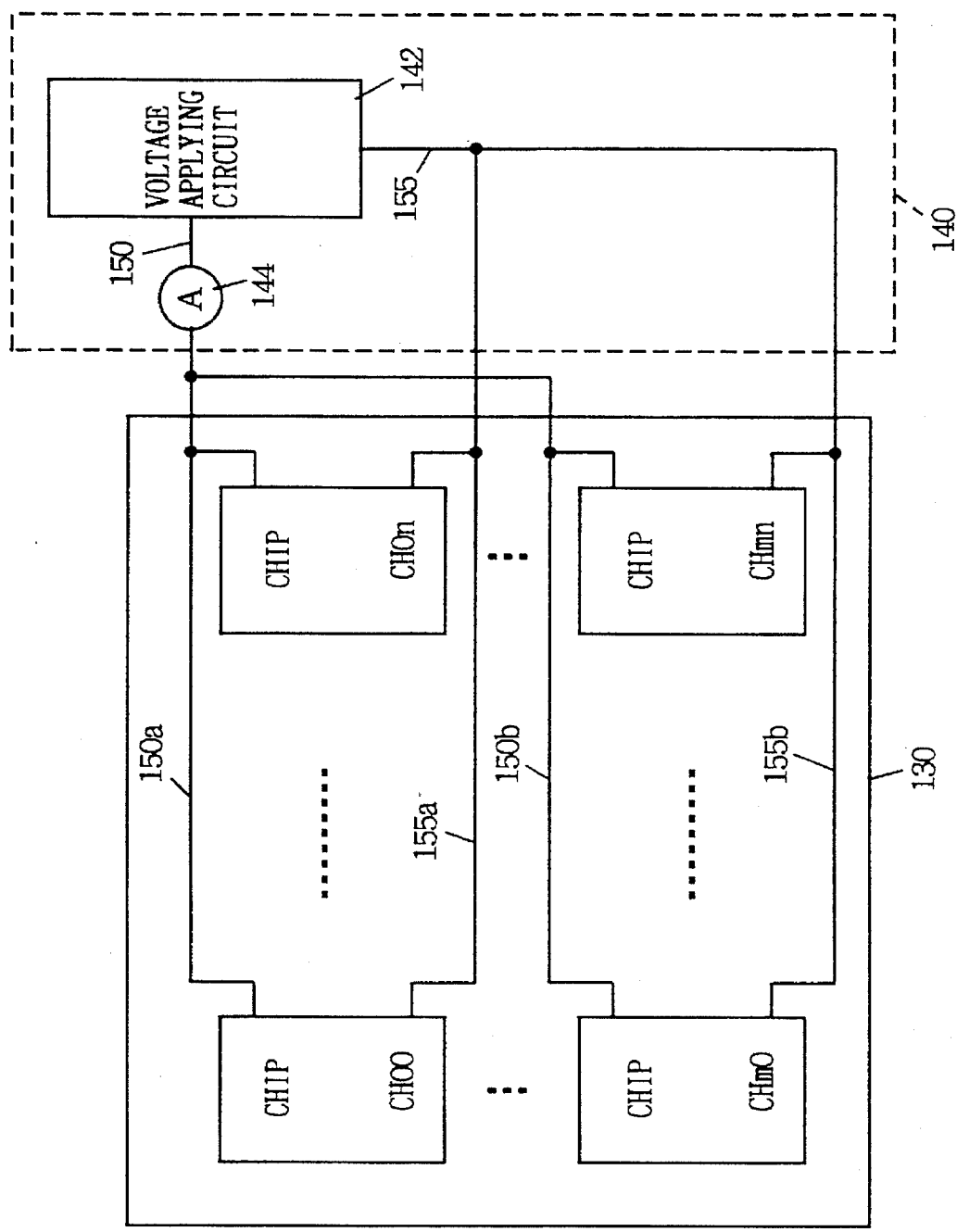
FIG. 19 is a diagram for showing an on-test arrangement of the semiconductor devices according to the present invention.
Figure 20:
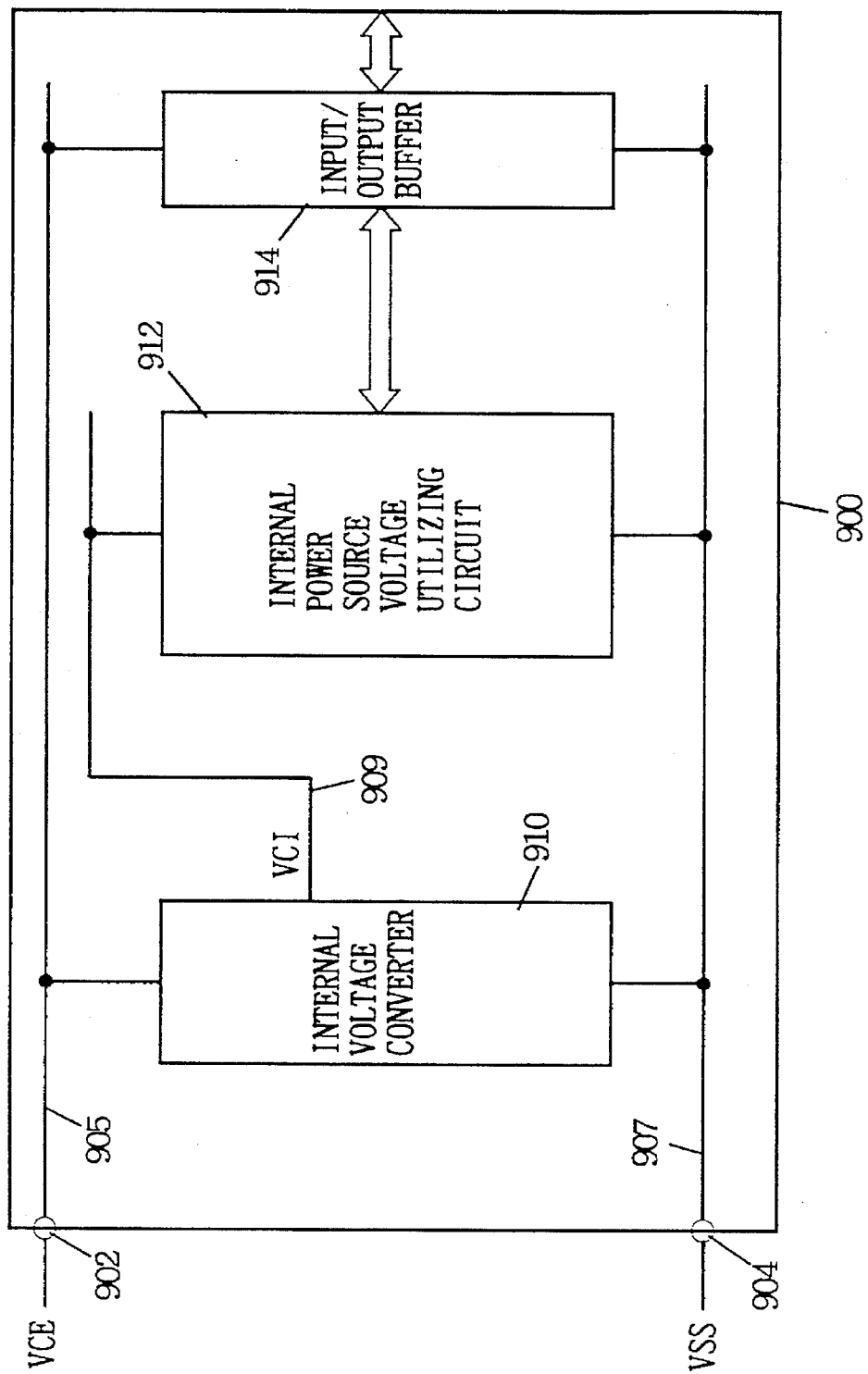
FIG. 20 is a diagram schematically showing the structure of a conventional semiconductor device.

FIG. 19 is a diagram showing an arrangement of semiconductor devices, which is used upon testing the semiconductor devices according to the present invention. In FIG. 19, semiconductor devices (chips) CH00 through CHmn are disposed on a test board 130. A testing apparatus 140 includes a voltage applying circuit 142 for applying a predetermined voltage to specific two pads of each of the individual semiconductor devices CH00 through CHmn. The voltage applying circuit 142 applies a predetermined voltage between a signal line 150 and a signal line 155. The signal line 150 is connected to signal lines 150a and 150b through an ammeter 144. The signal line 150a is connected to one (external pin terminal) of specific two pads (internal pin terminals) of each of the semiconductor devices CH00 through CH0n. The signal line 150b is connected to one of specific two pads of each of the semiconductor devices CHm0 through CHmn. The other of the specific two pads of each of the semiconductor devices CH00 through CH0n is connected to a signal line 155a. The other of the specific two pads of each of the semiconductor devices CHm0 through CHmn is connected to a signal line 155b. The signal lines 155a and 155b are connected to a signal line 155.

The specific two pads of the semiconductor devices CH00 through CHmn are all coupled in parallel to one another. Thus, whether or not each of the semiconductor devices CH00 through CHmn has been set to a predetermined internal state, can be identified by causing the ammeter 144 to detect a current flowing upon application of the voltage to the corresponding pads by the voltage applying circuit 142. Since, in this case, the sum of values of currents flowing in the semiconductor devices CH00 through CHmn is detected by the ammeter 144, even if the current flowing through the specific two pads of each of the semiconductor devices CH00 through CHmn measures a minute current value, the ammeter 144 can reliably identify whether or not the internal state of each of the semiconductor devices CH00 through CHmn has been set to a predetermined state.

Incidentally, the ammeter 144 may be provided corresponding to each of the semiconductor devices CH00 through CHmn.

The testing apparatus 140 includes a control circuit (not shown) and applies necessary signals such as the burn-in mode designation signal and the test mode designation signal or the like to each of the semiconductor devices CH00 through CHmn through the test board 130 so as to execute performance tests on the semiconductor devices CH00 through CHmn. The control circuit in the testing apparatus may be constructed to control the operation of the voltage applying circuit 142.

Incidentally, a high voltage may be set to any one of the signal lines 150 and 155.

As shown in FIG. 19, a check device for detecting an internal state of a monitor flip chip is not provided in the testing apparatus 140. Thus, the testing apparatus 140 is so simplified in structure. It is also unnecessary to use the monitor flip chip. The number of steps of testing each semiconductor device can be simplified (a step of preparing the monitor flip chip is omitted), thereby making it possible to efficiently make a test on each semiconductor device.

According to the present invention, as has been described above, since the current path different from an internal circuit is formed between the specific two pads in the semiconductor device, it is possible to externally and easily identify whether or not the internal state of a semiconductor device has been set to the predetermined state. Thus, the test on the semiconductor device can be simplified and made efficient, and the testing apparatus can be simplified in structure.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a plurality of separately provided pads for interfacing to an outside of said semiconductor device;

an inner circuit for executing a predetermined function; and current path forming means provided separately from said inner circuit, for coupling two pads of said plurality of pads to each other to form a current flowing path between said two pads in response to an internal state setting signal for setting said inner circuit to a predetermined state, said current path forming means including
        control signal generating means responsive to said internal state setting signal and a period designation signal for generating an activated control signal when said internal state setting signal and said period designation signal are both activated, and
        a switching element responsive to said active control signal for being conductive to connect said two pads to each other.

2. The semiconductor device as claimed in claim 1, wherein said current path forming means includes means for forming a current flowing path between said two pads when a predetermined voltage is applied to one of said two pads.

3. The semiconductor device as claimed in claim 1, wherein said two pads includes a power pad receiving an externally applied power source voltage, and a ground pad receiving an externally applied ground voltage.

4. The semiconductor device as claimed in claim 1, wherein said control signal generating means includes a flip-flop set in response to said internal state setting signal being active and reset in response to said period designation signal being active, and wherein said switching element rendered conductive when said flip-flop is set.

5. The semiconductor device as claimed in claim 4, wherein said period designation signal is a signal bringing said semiconductor device into an active state in which said inner circuit is enabled to operate.

6. The semiconductor device as recited in claim 1, wherein said plurality of pads include a power pad receiving an externally applied power source voltage for internal transmission, and a ground pad receiving an externally applied ground potential for internal transmission, and wherein said two pads includes a pad different from said power pad.

7. The semiconductor device as claimed in claim 6, wherein said two pads includes two pads different from said power pad and said ground pad.

8. The semiconductor device as claimed in claim 1, wherein said current path forming means includes a detector for detecting that a voltage applied to one of said two pads is made greater in absolute value than a predetermined value to be conductive, and a switching element coupled to said detector and responsive to the internal state setting signal for coupling said detector to the other of said two pads.

9. The semiconductor device as claimed in claim 8, wherein said detector includes a diode element connected forwardly from said one of said two pads to said switching element.

10. The semiconductor device as claimed in claim 8, wherein said detector includes a diode element connected forwardly from said switching element to said one of said two pads.

11. The semiconductor device as claimed in claim 1, wherein said control signal generating means includes a logic gate receiving said internal state setting signal and said period designation signal, for rendering said switching element conductive only when said internal state setting signal and said period designation signal both are active.

12. The semiconductor device as claimed in claim 1, wherein said inner circuit includes, a voltage generator coupled to receive an externally applied power source voltage for generating an internal power source voltage, and a booster coupled to receive said internal power source voltage to boost the internal power source voltage to generate a boosted voltage, a driver for utilizing said boosted voltage to perform a predetermined operation, and wherein said semiconductor device further includes a selector responsive to said internal state setting signal being active for transferring said internal power source voltage in place of said boosted voltage to said driver.

13. A semiconductor device comprising:

a plurality of pads for interfacing to an outside of said semiconductor device;

internal voltage generating means for generating an internal voltage having a predetermined voltage level, which is different in voltage level from a power source voltage externally supplied to a power pad included in said plurality of pads, said internal voltage generating means including means for changing the level of said internal voltage in response to an internal state setting signal;

an internal voltage utilizing circuit using said internal voltage; and current path forming means provided separately from said internal voltage utilizing circuit, for connecting specific two pads of said plurality of pads to each other upon activation of said internal state setting signal to form a current flowing path between said specific two pads, said current path forming means including
        control signal generating means responsive to said internal state setting signal and a period designation signal for generating an active control signal when said internal state setting signal and said period designation signal are both activated, and
        a switching element rendered conductive in response to said activated control signal to connect said specific two pads to each other.

14. The semiconductor device as claimed in claim 13, wherein said internal voltage generating means is an internal voltage down converter for down-converting the power source voltage externally supplied to said power pad to generate an internal operating power source voltage.

15. The semiconductor device as claimed in claim 14, wherein said internal state setting signal is a voltage change instructing signal for changing said internal operating power source voltage in accordance with the power source voltage externally supplied.

16. The semiconductor device as claimed in claim 14, wherein said internal voltage generating means includes an internal power source coupled to said power pad to generate an internal operating power source voltage from the power source voltage externally supplied and a boosting circuit for boosting the internal operating power source voltage generated from said internal power source.

17. The semiconductor device as claimed in claim 16, wherein said internal state setting signal is a signal for providing an instruction to reduce the level of the voltage boosted by said boosting circuit.

18. The semiconductor device as claimed in claim 13, wherein said current path forming means includes means for forming a current flowing path between said specific two pads when a predetermined voltage is applied to one of said specific two pads.

19. The semiconductor device as claimed in claim 13, wherein said internal voltage generating means includes a drive element coupled between said power pad and an internal power line for transferring said internal voltage, and a controller responsive to the internal voltage for controlling an amount of current flow supplied by said drive element, and wherein said current path forming means includes a switching element coupled between said internal power line and a ground pad included in said plurality of pads and responsive to said internal state setting signal for conducting to couple said internal power line to said ground pad.

20. The semiconductor device as claimed in claim 17, further comprising a selector responsive to said internal state setting signal being active for transferring said internal operating power source voltage in place of the boosted voltage.

21. A semiconductor device comprising:

a plurality of pads for establishing electrical connections between internal circuitry and outside said semiconductor device;

a logic circuit connected for receiving (1) an internal state setting signal for setting said internal circuitry to a predetermined state and (2) a period designation signal, and configured for responsively generating a control signal; and a switch coupled between two pads of said plurality of pads and configured to establish a current flow path between said two pads in response to said control signal.

22. A semiconductor device comprising:

a plurality of pads for establishing electrical connections between internal circuitry and the outside of said semiconductor device;

internal voltage generating means for generating an internal voltage of a predetermined level from that of a power source voltage externally supplied to a power supply receiving pad included among said plurality of pads, said internal voltage generating means being operative for changing the level of said internal voltage in response to an internal state setting signal;

an internal voltage utilizing circuit receiving said internal voltage;

a logic circuit, connected for receiving (1) an internal state setting signal for setting said internal circuitry to a predetermined state and (2) a period designation signal, and configured for responsively generating a control signal; and a switch coupled between prescribed two pads of said plurality of pads and configured to establish a current flow path between said two pads in response to said control signal.

23. The semiconductor device of claim 22, wherein said two pads of said plurality of pads are other than said power supply receiving pad.

* * * * *